(12) United States Patent
Hausmann et al.

(10) Patent No.: US 11,404,275 B2
(45) Date of Patent: Aug. 2, 2022

(54) SELECTIVE DEPOSITION USING HYDROLYSIS

(71) Applicant: Lam Research Corporation, Fremont, CA (US)

(72) Inventors: Dennis M. Hausmann, Lake Oswego, OR (US); Paul C. Lemaire, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/977,438

(22) PCT Filed: Mar. 1, 2019

(86) PCT No.: PCT/US2019/020408
§ 371 (c)(1),
(2) Date: Sep. 1, 2020

(87) PCT Pub. No.: WO2019/169335
PCT Pub. Date: Sep. 6, 2019

(65) Prior Publication Data
US 2021/0005460 A1 Jan. 7, 2021

Related U.S. Application Data

(60) Provisional application No. 62/637,995, filed on Mar. 2, 2018.

(51) Int. Cl.
*H01L 21/288* (2006.01)
*H01L 21/285* (2006.01)
(Continued)

(52) U.S. Cl.
CPC ...... *H01L 21/288* (2013.01); *H01L 21/28562* (2013.01); *H01L 21/76834* (2013.01); *H01L 21/02211* (2013.01)

(58) Field of Classification Search
None
See application file for complete search history.

(56) References Cited

U.S. PATENT DOCUMENTS

| 4,158,717 A | 6/1979 | Nelson |
| 4,419,809 A | 12/1983 | Riseman et al. |

(Continued)

FOREIGN PATENT DOCUMENTS

| CN | 1732288 A | 2/2006 |
| CN | 1841676 A | 10/2006 |

(Continued)

OTHER PUBLICATIONS

Aboaf, J.A. (1969) "Some Properties of Vapor Deposited Silicon Nitride Films Obtained by the Reaction of SiBr4 and NH 3," Journal of the Electrochemical Society, 116(12):1736-1740.

(Continued)

*Primary Examiner* — Erik Kielin
(74) *Attorney, Agent, or Firm* — Weaver Austin Villeneuve & Sampson LLP

(57) ABSTRACT

Methods and apparatuses for selective deposition of metal oxides on metal surfaces relative to dielectric surfaces are provided. Selective deposition is achieved by exposing metal and dielectric surfaces to a blocking reagent capable of forming a hydrolyzable bond with metal while forming a non hydrolyzable bond with the dielectric, and dipping the surfaces in water to cleave the hydrolyzable bond and leave a blocked surface on the dielectric surface, followed by depositing metal oxide selectively on the metal surface relative to the dielectric surface. Blocking reagents are deposited by wet or dry techniques and may include an alkylaminosilane or alkylchlorosilane as examples.

19 Claims, 8 Drawing Sheets

(51) Int. Cl.
*H01L 21/768* (2006.01)
*H01L 21/02* (2006.01)

(56) References Cited

U.S. PATENT DOCUMENTS

| | | |
|---|---|---|
| 4,500,563 A | 2/1985 | Ellenberger et al. |
| 4,539,061 A | 9/1985 | Sagiv |
| 4,575,921 A | 3/1986 | Bhagat |
| 4,869,781 A | 9/1989 | Euen et al. |
| 5,091,332 A | 2/1992 | Bohr et al. |
| 5,202,272 A | 4/1993 | Hsieh et al. |
| 5,230,929 A | 7/1993 | Caporiccio et al. |
| 5,314,724 A | 5/1994 | Tsukune et al. |
| 5,459,099 A | 10/1995 | Hsu |
| 5,496,608 A | 3/1996 | Matsuda et al. |
| 5,528,719 A | 6/1996 | Yamada |
| 5,670,432 A | 9/1997 | Tsai |
| 5,731,235 A | 3/1998 | Srinivasan et al. |
| 5,854,105 A | 12/1998 | Tseng |
| 5,856,003 A | 1/1999 | Chiu |
| 5,891,805 A | 4/1999 | Cheng et al. |
| 5,976,990 A | 11/1999 | Mercaldi et al. |
| 6,039,834 A | 3/2000 | Tanaka et al. |
| 6,153,519 A | 11/2000 | Jain et al. |
| 6,197,701 B1 | 3/2001 | Shue et al. |
| 6,225,175 B1 | 5/2001 | Houston |
| 6,228,779 B1 | 5/2001 | Bloom et al. |
| 6,326,322 B1 | 12/2001 | Kim et al. |
| 6,380,056 B1 | 4/2002 | Shue et al. |
| 6,395,652 B2 | 5/2002 | Kim et al. |
| 6,403,416 B1 | 6/2002 | Huang et al. |
| 6,416,822 B1 | 7/2002 | Chiang et al. |
| 6,423,582 B1 | 7/2002 | Fischer et al. |
| 6,428,859 B1 | 8/2002 | Chiang et al. |
| 6,518,167 B1 | 2/2003 | You et al. |
| 6,534,395 B2 | 3/2003 | Werkhoven et al. |
| 6,548,368 B1 | 4/2003 | Narwankar et al. |
| 6,593,000 B2 | 7/2003 | Ohtake et al. |
| 6,632,478 B2 | 10/2003 | Gaillard et al. |
| 6,632,741 B1 | 10/2003 | Clevenger et al. |
| 6,638,879 B2 | 10/2003 | Hsieh et al. |
| 6,645,574 B1 | 11/2003 | Lee et al. |
| 6,709,928 B1 | 3/2004 | Jenne et al. |
| 6,730,614 B1 | 5/2004 | Lim et al. |
| 6,794,284 B2 | 9/2004 | Vaartstra |
| 6,926,798 B2 | 8/2005 | Biberger et al. |
| 6,933,245 B2 | 8/2005 | Lee et al. |
| 6,967,159 B2 | 11/2005 | Vaartstra |
| 7,019,159 B2 | 3/2006 | Dussarrat et al. |
| 7,041,335 B2 | 5/2006 | Chung |
| 7,172,792 B2 | 2/2007 | Wang et al. |
| 7,297,641 B2 | 11/2007 | Todd et al. |
| 7,300,885 B2 | 11/2007 | Hasebe et al. |
| 7,301,210 B2 | 11/2007 | Abadeer et al. |
| 7,351,668 B2 | 4/2008 | Chou et al. |
| 7,462,571 B2 | 12/2008 | Hasebe et al. |
| 7,465,669 B2 | 12/2008 | Iyer et al. |
| 7,482,247 B1 | 1/2009 | Papasouliotis et al. |
| 7,507,676 B2 | 3/2009 | Chou et al. |
| 7,510,984 B2 | 3/2009 | Saito et al. |
| 7,514,366 B2 | 4/2009 | Trivedi et al. |
| 7,611,980 B2 | 11/2009 | Wells et al. |
| 7,622,369 B1 | 11/2009 | Lee et al. |
| 7,629,267 B2 | 12/2009 | Wan et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,700,492 B2 | 4/2010 | Kikuchi |
| 7,713,592 B2 | 5/2010 | Nguyen et al. |
| 7,728,436 B2 | 6/2010 | Whelan et al. |
| 7,732,343 B2 | 6/2010 | Niroomand et al. |
| 7,758,920 B2 | 7/2010 | Hasebe et al. |
| 7,807,578 B2 | 10/2010 | Bencher et al. |
| 7,825,039 B2 | 11/2010 | Takahashi et al. |
| 7,875,312 B2 | 1/2011 | Thridandam et al. |
| 7,910,288 B2 | 3/2011 | Abatchev et al. |
| 7,910,497 B2 | 3/2011 | Olsen et al. |
| 7,919,416 B2 | 4/2011 | Lee et al. |
| 7,939,455 B2 | 5/2011 | Clark |
| 7,964,241 B2 | 6/2011 | Hasebe et al. |
| 7,964,513 B2 | 6/2011 | Todd et al. |
| 7,989,365 B2 | 8/2011 | Park et al. |
| 8,034,673 B2 | 10/2011 | Kadonaga et al. |
| 8,043,907 B2 | 10/2011 | Ma et al. |
| 8,080,290 B2 | 12/2011 | Hasebe et al. |
| 8,084,088 B2 | 12/2011 | Huy et al. |
| 8,105,901 B2 | 1/2012 | Cheng et al. |
| 8,119,544 B2 | 2/2012 | Hasebe et al. |
| 8,129,555 B2 | 3/2012 | Cheng et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,298,628 B2 | 10/2012 | Yang et al. |
| 8,298,954 B1 | 10/2012 | Arnold et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,530,361 B2 | 9/2013 | Xiao et al. |
| 8,592,005 B2 | 11/2013 | Ueda |
| 8,592,328 B2 | 11/2013 | Hausmann et al. |
| 8,623,770 B1 | 1/2014 | Gao et al. |
| 8,668,957 B2 | 3/2014 | Dussarrat et al. |
| 8,669,185 B2 | 3/2014 | Onizawa et al. |
| 8,703,578 B2 | 4/2014 | Hoentschel et al. |
| 8,728,956 B2 | 5/2014 | LaVoie et al. |
| 8,753,984 B2 | 6/2014 | Murakami et al. |
| 8,791,034 B2 | 7/2014 | Shealy et al. |
| 8,821,986 B2 | 9/2014 | Weidman et al. |
| 8,846,484 B2 | 9/2014 | Lee et al. |
| 8,853,075 B2 | 10/2014 | Gatineau et al. |
| 8,936,977 B2 | 1/2015 | Hoentschel et al. |
| 8,940,648 B2 | 1/2015 | Xiao et al. |
| 8,945,305 B2 | 2/2015 | Marsh |
| 8,975,704 B2 | 3/2015 | Hoentschel et al. |
| 9,023,693 B1 | 5/2015 | Lin et al. |
| 9,023,737 B2 | 5/2015 | Beynet et al. |
| 9,070,555 B2 | 6/2015 | Hausmann et al. |
| 9,095,869 B2 | 8/2015 | Kilpi et al. |
| 9,214,333 B1 | 12/2015 | Sims et al. |
| 9,219,007 B2 | 12/2015 | Chen et al. |
| 9,257,334 B2 | 2/2016 | Chen et al. |
| 9,331,094 B2 | 5/2016 | Hada |
| 9,355,839 B2 | 5/2016 | Swaminathan et al. |
| 9,371,338 B2 | 6/2016 | Dussarrat et al. |
| 9,390,909 B2 | 7/2016 | Pasquale et al. |
| 9,406,693 B1 | 8/2016 | Pang et al. |
| 9,443,731 B1 | 9/2016 | O'Meara et al. |
| 9,472,506 B2 | 10/2016 | Conklin et al. |
| 9,502,234 B2 | 11/2016 | Xiao et al. |
| 9,502,238 B2 | 11/2016 | Danek et al. |
| 9,508,604 B1 | 11/2016 | Sung et al. |
| 9,530,663 B1 | 12/2016 | Shih et al. |
| 9,564,312 B2 | 2/2017 | Henri et al. |
| 9,576,817 B1 | 2/2017 | Cheng et al. |
| 9,589,790 B2 | 3/2017 | Henri et al. |
| 9,601,693 B1 | 3/2017 | Henri et al. |
| 9,611,544 B2 | 4/2017 | LaVoie et al. |
| 9,670,579 B2 | 6/2017 | Hausmann et al. |
| 9,721,784 B2 | 8/2017 | Behera et al. |
| 9,865,815 B2 | 1/2018 | Hausmann |
| 9,875,891 B2 | 1/2018 | Henri et al. |
| 9,892,933 B2 | 2/2018 | Peng et al. |
| 9,905,415 B2 | 2/2018 | Chandra et al. |
| 9,911,595 B1 | 3/2018 | Smith et al. |
| 10,038,079 B1* | 7/2018 | Ohtou ............ H01L 21/823821 |
| 10,043,656 B1* | 8/2018 | Smith ............. C23C 16/45534 |
| 10,074,543 B2 | 9/2018 | Mahorowala et al. |
| 10,134,579 B2 | 11/2018 | Baldasseroni et al. |
| 10,141,505 B2 | 11/2018 | Hausmann |
| 10,176,984 B2 | 1/2019 | Smith et al. |
| 10,199,212 B2 | 2/2019 | Smith et al. |
| 10,242,866 B2 | 3/2019 | Smith et al. |
| 10,269,559 B2 | 4/2019 | Abel et al. |

(56) References Cited

U.S. PATENT DOCUMENTS

| | | | |
|---|---|---|---|
| 10,454,029 B2 | 10/2019 | McKerrow et al. |
| 10,460,930 B2 | 10/2019 | Hausmann et al. |
| 10,490,413 B2 | 11/2019 | Smith et al. |
| 10,559,461 B2 | 2/2020 | Reddy et al. |
| 10,629,429 B2 | 4/2020 | Smith et al. |
| 10,629,435 B2 | 4/2020 | Swaminathan et al. |
| 10,658,172 B2 | 5/2020 | Abel et al. |
| 10,662,526 B2 * | 5/2020 | Hausmann ............. C23C 16/04 |
| 10,777,407 B2 | 9/2020 | Smith et al. |
| 10,804,099 B2 | 10/2020 | Henri et al. |
| 10,825,679 B2 | 11/2020 | Hausmann et al. |
| 10,832,908 B2 | 11/2020 | LaVoie |
| 10,903,071 B2 | 1/2021 | Smith et al. |
| 10,998,187 B2 | 5/2021 | Reddy et al. |
| 2002/0001889 A1 | 1/2002 | Kim et al. |
| 2002/0001929 A1 | 1/2002 | Biberger et al. |
| 2002/0185225 A1 * | 12/2002 | Toshima ................ B08B 9/08 |
| | | 156/345.33 |
| 2003/0143841 A1 | 7/2003 | Yang et al. |
| 2004/0043570 A1 | 3/2004 | Fujisaki et al. |
| 2004/0087176 A1 | 5/2004 | Colburn et al. |
| 2004/0166680 A1 | 8/2004 | Miyajima et al. |
| 2004/0259378 A1 | 12/2004 | Chambers et al. |
| 2005/0017319 A1 | 1/2005 | Manabe et al. |
| 2005/0025885 A1 | 2/2005 | McSwiney et al. |
| 2005/0042865 A1 | 2/2005 | Cabral et al. |
| 2005/0091931 A1 | 5/2005 | Gracias |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0123690 A1 | 6/2005 | Derderian et al. |
| 2005/0142878 A1 | 6/2005 | Jung |
| 2005/0158983 A1 | 7/2005 | Hoshi et al. |
| 2005/0159017 A1 | 7/2005 | Kim et al. |
| 2005/0170104 A1 | 8/2005 | Jung et al. |
| 2005/0196977 A1 | 9/2005 | Saito et al. |
| 2005/0208778 A1 | 9/2005 | Li et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0003557 A1 | 1/2006 | Cabral, Jr. et al. |
| 2006/0008656 A1 | 1/2006 | Veerasamy |
| 2006/0032442 A1 | 2/2006 | Hasebe |
| 2006/0032443 A1 | 2/2006 | Hasebe et al. |
| 2006/0084283 A1 | 4/2006 | Paranjpe et al. |
| 2006/0088985 A1 | 4/2006 | Haverkort et al. |
| 2006/0119248 A1 | 6/2006 | Howard et al. |
| 2006/0128142 A1 | 6/2006 | Whelan et al. |
| 2006/0199357 A1 | 9/2006 | Wan et al. |
| 2006/0263699 A1 | 11/2006 | Abatchev et al. |
| 2006/0273456 A1 | 12/2006 | Sant et al. |
| 2006/0286776 A1 | 12/2006 | Ranish et al. |
| 2006/0289385 A1 | 12/2006 | Kikuchi |
| 2007/0032047 A1 | 2/2007 | Hasebe et al. |
| 2007/0099431 A1 | 5/2007 | Li |
| 2007/0137572 A1 | 6/2007 | Matsuura et al. |
| 2007/0148968 A1 | 6/2007 | Kwon et al. |
| 2007/0167028 A1 | 7/2007 | Chou et al. |
| 2007/0190782 A1 | 8/2007 | Park |
| 2007/0212850 A1 | 9/2007 | Ingle et al. |
| 2007/0218661 A1 | 9/2007 | Shroff et al. |
| 2007/0238299 A1 | 10/2007 | Niroomand et al. |
| 2007/0238316 A1 | 10/2007 | Ohashi |
| 2007/0251444 A1 | 11/2007 | Gros-Jean et al. |
| 2007/0298585 A1 | 12/2007 | Lubomirsky et al. |
| 2008/0032064 A1 | 2/2008 | Gordon et al. |
| 2008/0038936 A1 | 2/2008 | Todd et al. |
| 2008/0063791 A1 | 3/2008 | Hasebe et al. |
| 2008/0081104 A1 | 4/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0142483 A1 | 6/2008 | Hua et al. |
| 2008/0213479 A1 | 9/2008 | Chou et al. |
| 2008/0237726 A1 | 10/2008 | Dyer |
| 2008/0237861 A1 | 10/2008 | Dominguez et al. |
| 2008/0242097 A1 | 10/2008 | Boescke et al. |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0075490 A1 | 3/2009 | Dussarrat |
| 2009/0146322 A1 | 6/2009 | Weling et al. |
| 2009/0148625 A1 | 6/2009 | Yeom et al. |
| 2009/0155606 A1 | 6/2009 | Yoon et al. |
| 2009/0163041 A1 | 6/2009 | Mungekar et al. |
| 2009/0191722 A1 | 7/2009 | Hasebe et al. |
| 2009/0286381 A1 | 11/2009 | Van Schravendijk et al. |
| 2010/0003797 A1 | 1/2010 | Smith |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0144146 A1 * | 6/2010 | Utaka ............. H01L 27/11507 |
| | | 438/682 |
| 2010/0151681 A1 | 6/2010 | Knapp et al. |
| 2010/0221925 A1 | 9/2010 | Lee et al. |
| 2010/0267238 A1 | 10/2010 | Johnson et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0025673 A1 | 2/2011 | Chen et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0159673 A1 | 6/2011 | Hanawa et al. |
| 2011/0176967 A1 | 7/2011 | Okuda et al. |
| 2011/0178092 A1 | 7/2011 | Ali et al. |
| 2011/0183528 A1 | 7/2011 | Wang et al. |
| 2011/0244142 A1 | 10/2011 | Cheng et al. |
| 2011/0256721 A1 | 10/2011 | Gatineau |
| 2011/0256724 A1 | 10/2011 | Chandrasekharan et al. |
| 2011/0256734 A1 | 10/2011 | Hausmann et al. |
| 2012/0009802 A1 | 1/2012 | LaVoie et al. |
| 2012/0009803 A1 | 1/2012 | Jung et al. |
| 2012/0028469 A1 | 2/2012 | Onizawa et al. |
| 2012/0058282 A1 | 3/2012 | Hong et al. |
| 2012/0068347 A1 | 3/2012 | Isobayashi et al. |
| 2012/0104347 A1 | 5/2012 | Quick |
| 2012/0108079 A1 | 5/2012 | Mahajani |
| 2012/0115074 A1 | 5/2012 | Zhang et al. |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1 | 6/2012 | Ha et al. |
| 2012/0171846 A1 | 7/2012 | Hwang |
| 2012/0177841 A1 | 7/2012 | Thompson |
| 2012/0205315 A1 | 8/2012 | Liu et al. |
| 2012/0213940 A1 | 8/2012 | Mallick |
| 2012/0225553 A1 | 9/2012 | Lazovsky et al. |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2012/0315740 A1 | 12/2012 | Yao |
| 2013/0017328 A1 | 1/2013 | Miyoshi et al. |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0189845 A1 | 7/2013 | Kim et al. |
| 2013/0189854 A1 | 7/2013 | Hausmann et al. |

(56) References Cited

U.S. PATENT DOCUMENTS

| | | |
|---|---|---|
| 2013/0210236 A1 | 8/2013 | Ogihara et al. |
| 2013/0252437 A1 | 9/2013 | Sano et al. |
| 2013/0323435 A1 | 12/2013 | Xiao et al. |
| 2013/0327636 A1 | 12/2013 | Majetich et al. |
| 2013/0344248 A1 | 12/2013 | Clark |
| 2014/0023794 A1 | 1/2014 | Mahajani et al. |
| 2014/0113455 A1 | 4/2014 | Reimer et al. |
| 2014/0113457 A1 | 4/2014 | Sims et al. |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0170853 A1 | 6/2014 | Shamma et al. |
| 2014/0193983 A1 | 7/2014 | LaVoie |
| 2014/0216337 A1 | 8/2014 | Swaminathan et al. |
| 2014/0252486 A1 | 9/2014 | Lin et al. |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2014/0363969 A1 | 12/2014 | Chen et al. |
| 2015/0004806 A1 | 1/2015 | Ndiege et al. |
| 2015/0014823 A1 | 1/2015 | Mallikarjunan et al. |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0087139 A1 | 3/2015 | O'Neill et al. |
| 2015/0111374 A1 | 4/2015 | Bao et al. |
| 2015/0126042 A1 | 5/2015 | Pasquale et al. |
| 2015/0132965 A1 | 5/2015 | Devilliers et al. |
| 2015/0137061 A1 | 5/2015 | Donghi et al. |
| 2015/0147871 A1 | 5/2015 | Xiao et al. |
| 2015/0155198 A1 | 6/2015 | Tsai et al. |
| 2015/0155523 A1 | 6/2015 | Kamiya |
| 2015/0162416 A1 | 6/2015 | Chang et al. |
| 2015/0179438 A1 | 6/2015 | Ahmed et al. |
| 2015/0200110 A1 | 7/2015 | Li et al. |
| 2015/0206719 A1 | 7/2015 | Swaminathan et al. |
| 2015/0235835 A1 | 8/2015 | Swaminathan et al. |
| 2015/0243708 A1 | 8/2015 | Ravasio et al. |
| 2015/0249153 A1 | 9/2015 | Morin et al. |
| 2015/0251917 A1 | 9/2015 | Hong et al. |
| 2015/0259791 A1 | 9/2015 | Hausmann et al. |
| 2015/0299848 A1 | 10/2015 | Haukka et al. |
| 2015/0340225 A1 | 11/2015 | Kim et al. |
| 2015/0364372 A1 | 12/2015 | Chen et al. |
| 2015/0371896 A1 | 12/2015 | Chen et al. |
| 2016/0020092 A1 | 1/2016 | Kang et al. |
| 2016/0024647 A1 | 1/2016 | Saly et al. |
| 2016/0042950 A1 | 2/2016 | Dai et al. |
| 2016/0046501 A1 | 2/2016 | Kverel et al. |
| 2016/0049307 A1 | 2/2016 | Chen |
| 2016/0056074 A1 | 2/2016 | Na et al. |
| 2016/0064224 A1 | 3/2016 | Hung et al. |
| 2016/0079054 A1 | 3/2016 | Chen et al. |
| 2016/0079521 A1 | 3/2016 | Draeger et al. |
| 2016/0093484 A1 | 3/2016 | Marsh |
| 2016/0099143 A1 | 4/2016 | Yan et al. |
| 2016/0109804 A1 | 4/2016 | Huli |
| 2016/0111297 A1 | 4/2016 | Chen et al. |
| 2016/0126106 A1 | 5/2016 | Shimizu et al. |
| 2016/0148800 A1 | 5/2016 | Henri et al. |
| 2016/0148806 A1 | 5/2016 | Henri et al. |
| 2016/0155739 A1 | 6/2016 | Ting et al. |
| 2016/0172194 A1 | 6/2016 | Kunnen et al. |
| 2016/0178019 A1 | 6/2016 | Stephenson et al. |
| 2016/0225640 A1 | 8/2016 | Raley et al. |
| 2016/0247678 A1 | 8/2016 | Feng et al. |
| 2016/0247680 A1 | 8/2016 | O'Meara et al. |
| 2016/0280724 A1 | 9/2016 | Arkles et al. |
| 2016/0281230 A1 | 9/2016 | Varadarajan et al. |
| 2016/0284567 A1 | 9/2016 | Reilly et al. |
| 2016/0293398 A1 | 10/2016 | Danek et al. |
| 2016/0293418 A1 | 10/2016 | Pasquale et al. |
| 2016/0300718 A1 | 10/2016 | Raley et al. |
| 2016/0322213 A1 | 11/2016 | Thompson et al. |
| 2016/0329238 A1 | 11/2016 | Tang et al. |
| 2016/0336178 A1 | 11/2016 | Swaminathan et al. |
| 2016/0336187 A1 | 11/2016 | Liou et al. |
| 2016/0365425 A1 | 12/2016 | Chen et al. |
| 2016/0372334 A1 | 12/2016 | Mignot et al. |
| 2016/0376152 A1 | 12/2016 | Toutonghi |
| 2017/0004974 A1 | 1/2017 | Manna et al. |
| 2017/0012001 A1 | 1/2017 | Gordon et al. |
| 2017/0029947 A1 | 2/2017 | Kawahara et al. |
| 2017/0029948 A1 | 2/2017 | Jongbloed et al. |
| 2017/0069510 A1 | 3/2017 | Kal et al. |
| 2017/0069527 A1 | 3/2017 | Haukka et al. |
| 2017/0092496 A1 | 3/2017 | Devilliers |
| 2017/0092857 A1 | 3/2017 | Hausmann |
| 2017/0110550 A1 | 4/2017 | Tsai et al. |
| 2017/0117134 A1 | 4/2017 | Henri et al. |
| 2017/0148637 A1 | 5/2017 | Devilliers |
| 2017/0148642 A1 | 5/2017 | Wang et al. |
| 2017/0170015 A1 | 6/2017 | Kim et al. |
| 2017/0170026 A1 | 6/2017 | Hudson et al. |
| 2017/0323781 A1* | 11/2017 | Kachian ............ C23C 16/45527 |
| 2017/0323785 A1 | 11/2017 | Singhal et al. |
| 2017/0338109 A1 | 11/2017 | Lei et al. |
| 2017/0342553 A1 | 11/2017 | Yu et al. |
| 2018/0005814 A1 | 1/2018 | Kumar et al. |
| 2018/0012752 A1* | 1/2018 | Tapily ............... H01L 21/76826 |
| 2018/0033622 A1 | 2/2018 | Swaminathan et al. |
| 2018/0061628 A1 | 3/2018 | Ou et al. |
| 2018/0061650 A1 | 3/2018 | Mahorowala et al. |
| 2018/0114903 A1 | 4/2018 | Hausmann |
| 2018/0138028 A1 | 5/2018 | Henri et al. |
| 2018/0138036 A1 | 5/2018 | Baldasseroni et al. |
| 2018/0138040 A1 | 5/2018 | LaVoie |
| 2018/0138405 A1 | 5/2018 | McKerrow et al. |
| 2018/0166379 A1* | 6/2018 | Yeo ................... H01L 21/30604 |
| 2018/0223429 A1 | 8/2018 | Fukazawa et al. |
| 2018/0233349 A1 | 8/2018 | Smith et al. |
| 2018/0261447 A1 | 9/2018 | Smith et al. |
| 2018/0261448 A1 | 9/2018 | Smith et al. |
| 2018/0269058 A1 | 9/2018 | Smith et al. |
| 2018/0308680 A1 | 10/2018 | Reddy et al. |
| 2019/0080903 A1 | 3/2019 | Abel et al. |
| 2019/0115207 A1 | 4/2019 | Smith et al. |
| 2019/0148128 A1 | 5/2019 | Smith et al. |
| 2019/0157076 A1 | 5/2019 | Hausmann et al. |
| 2019/0164758 A1* | 5/2019 | Su ....................... H01L 21/3115 |
| 2019/0206677 A1 | 7/2019 | Abel et al. |
| 2020/0013615 A1 | 1/2020 | Hausmann et al. |
| 2020/0118809 A1 | 4/2020 | Reddy et al. |
| 2020/0219718 A1 | 7/2020 | Smith et al. |
| 2020/0234943 A1 | 7/2020 | Bhuyan et al. |

FOREIGN PATENT DOCUMENTS

| | | |
|---|---|---|
| CN | 101006195 A | 7/2007 |
| CN | 101255548 A | 9/2008 |
| CN | 101328578 A | 12/2008 |
| CN | 101378007 A | 3/2009 |
| CN | 101648964 A | 2/2010 |
| CN | 102471885 A | 5/2012 |
| CN | 102906305 A | 1/2013 |
| CN | 103225071 A | 7/2013 |
| CN | 103515197 A | 1/2014 |
| CN | 103632955 A | 3/2014 |
| CN | 104046955 A | 9/2014 |
| CN | 104752199 A | 7/2015 |
| CN | 105789027 A | 7/2016 |
| CN | 105917445 A | 8/2016 |
| CN | 105977141 A | 9/2016 |
| EP | 0277766 A2 | 8/1988 |
| EP | 2278046 A1 | 1/2011 |
| GB | 1181559 A | 2/1970 |
| JP | 2005011904 A | 1/2005 |
| JP | 2005163084 A | 6/2005 |
| JP | 2005210076 A | 8/2005 |

(56) References Cited

FOREIGN PATENT DOCUMENTS

| | | |
|---|---|---|
| JP | 2006060091 A | 3/2006 |
| JP | 2006080359 A | 3/2006 |
| JP | 2007281181 A | 10/2007 |
| JP | 2008517479 A | 5/2008 |
| JP | 2008306093 A | 12/2008 |
| JP | 2009170823 A | 7/2009 |
| JP | 2010010497 A | 1/2010 |
| JP | 2010527138 A | 8/2010 |
| JP | 2010232214 A | 10/2010 |
| JP | 2010239103 A | 10/2010 |
| JP | 2010283388 A | 12/2010 |
| JP | 2011192776 A | 9/2011 |
| JP | 2012084707 A | 4/2012 |
| JP | 2012142574 A | 7/2012 |
| JP | 2012169408 A | 9/2012 |
| JP | 2013079447 A | 5/2013 |
| JP | 2013153164 A | 8/2013 |
| JP | 2013182951 A | 9/2013 |
| JP | 2013225655 A | 10/2013 |
| JP | 2014038968 A | 2/2014 |
| JP | 2014179607 A | 9/2014 |
| JP | 2014532304 A | 12/2014 |
| JP | 2019165256 A | 9/2019 |
| KR | 20010075177 A | 8/2001 |
| KR | 100561493 B1 | 3/2006 |
| KR | 1020080109218 A | 12/2008 |
| KR | 20090080019 A | 7/2009 |
| KR | 20090131821 A | 12/2009 |
| KR | 20100128863 A | 12/2010 |
| KR | 20150025224 A | 3/2015 |
| KR | 20150053253 A | 5/2015 |
| KR | 20150103642 A | 9/2015 |
| KR | 20160033057 A | 3/2016 |
| KR | 20170016310 A | 2/2017 |
| KR | 20170135760 A | 12/2017 |
| KR | 20180029934 A | 3/2018 |
| KR | 20200108242 A | 9/2020 |
| SG | 10201801817 | 10/2018 |
| TW | 483103 B | 4/2002 |
| TW | 201033739 A | 9/2010 |
| TW | 201439105 A | 10/2014 |
| TW | 201606855 A | 2/2016 |
| WO | WO-2006018441 A1 | 2/2006 |
| WO | WO-2006026350 A2 | 3/2006 |
| WO | WO-2011130397 A2 | 10/2011 |
| WO | WO-2012061593 A2 | 5/2012 |
| WO | WO-2013043330 A1 | 3/2013 |
| WO | WO-2013066667 A1 | 5/2013 |
| WO | WO-2013137115 A1 | 9/2013 |
| WO | WO-2014030393 A1 | 2/2014 |
| WO | WO-2014209327 A1 | 12/2014 |
| WO | WO-2016048336 A1 | 3/2016 |
| WO | WO-2016138284 A1 | 9/2016 |
| WO | WO-2016178978 A1 | 11/2016 |
| WO | WO-2016209570 A1 | 12/2016 |
| WO | WO-2017048911 A1 | 3/2017 |
| WO | WO-2017062614 A1 | 4/2017 |
| WO | WO-2018195423 A1 | 10/2018 |

OTHER PUBLICATIONS

A.J.M Mackus, et al., "Fully Self-Aligned Vias: The Killer Application for Area-Selective ALD?—A Discussion of Requirements for Implementation in High Volume Manufacturing" 2019, 7, Atomic Limits, pp. 1-6. <url:<a href="https://www.atomiclimits.com">https://www.atomiclimits.com retrieved Aug. 26, 2020.</url:<a>.

Becker, F.S. and Rohl, S. (Nov. 1987) "Low Pressure Deposition of Doped SiO2 by Pyrolysis of Tetraethylorthosilicate (TEOS)," J. Electrochem. Soc.: Solid-State Science and Technology, 134(11):2923-2931.

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

Chabal et al. (2016) "Atomic Layer Deposition of Silicon Dioxide Using Aminosilanes Di-sec-butylaminosilane and Bis(tert-butylamino)silane with Ozone," The Journal of Physical Chemistry C, ACS Publications, American Chemical Society, 120:10927-10935.

Chen et al. (2011) "Ozone-Based Atomic Layer Deposition of Crystalline V2O5 Films for High Performance Electrochemical Energy Storage," Chemistry of Materials, ACS Publications, American Chemical Society, 7pp.

Chen, Rong and Bent, Stacey F. (2006) "Chemistry for Positive Pattern Transfer Using Area-Selective Atomic Layer Deposition," Adv. Mater., 18:1086-1090.

Chinese First Office Action dated Apr. 12, 2021 issued in Application No. CN 201711112653.9.

Chinese First Office Action dated Jul. 31, 2020 issued in Application No. CN 201710636255.0.

Chinese First Office Action dated Jun. 23, 2020 issued in Application No. CN 201811075877.1.

Chinese First Office Action dated Mar. 30, 2018 issued in Application No. CN 201610206201.6.

Chinese First Office Action dated May 19, 2016 issued in Application No. CN 201310021460.8.

Chinese First Office Action dated May 28, 2021 issued in Application No. CN 201810151668.4.

Chinese First Office Action dated Nov. 13, 2020 issued in Application No. CN 201710772400.8.

Chinese First Office Action dated Nov. 8, 2017 issued in Application No. CN 201510615853.0.

Chinese Fourt Office Action dated May 16, 2018 issued in Application No. CN 201310021460.8.

Chinese Notification of Reexamination dated Apr. 17, 2020 issued in Application No. CN 201310021460.8.

Chinese Second Office Action dated Apr. 13, 2017 issued in Application No. CN 201310021460.8.

Chinese Second Office Action dated Jan. 24, 2019 issued in Application No. CN 201610206201.6.

Chinese Second Office Action dated Mar. 15, 2021 issued in Application No. CN 201811075877.1.

Chinese Third Office Action dated Oct. 17, 2017 issued in Application No. CN 201310021460.8.

CN Office Action dated Nov. 19, 2021, in application No. CN201711112653 with English translation.

CN Office Action dated Sep. 2, 2021, in application No. CN201811075877.1 with English translation.

Dangerfield et al. (2016) "Role of Trimethylaluminum (TMA) for Low Temperature SiNx Deposition: Growth Dependence on Number of TMA Exposures," ALD Conference 2016, 14pp.

Dangerfield et al.,"Role of Trimethylaluminum in Low Temperature Atomic Layer Deposition of Silicon Nitride" Chemistry of Materials, Jun. 27, 2017, vol. 29, No. 14, pp. 6022-6029.

European Examination Report dated Dec. 11, 2017 issued in Application No. EP 13 15 2046.

European Extended Search Report dated Apr. 14, 2014 issued in Application No. EP13152046.2.

Han et al. (2012) "On the Mechanisms of SiO2 Thin-Film Growth by the Full Atomic Layer Deposition Process Using Bis(t-butylamino)silane on the Hydroxylated SiO2(001) Surface," The Journal of Physical Chemistry C, ACS Publications, American Chemical Society, 116:947-952.

Hong, J. et al., "ALD Resist Formed by Vapor-Deposited Self-Assembled Monolayers" Langmuir, vol. 23, No. 3, (2007) pp. 1160-1165.

Huang et al. (2017) "Design of efficient mono-aminosilane precursors for atomic layer deposition of SiO2 thin films," Royal Society of Chemistry Adv. 2017, 7:22672-22678.

International Preliminary Report on Patentability dated Sep. 17, 2020 issued in Application No. PCT/US2019/020408.

International Search Report and Written Opinion dated Jun. 17, 2019 issued in Application No. PCT/US2019/020408.

International Preliminary Report on Patentability dated Feb. 17, 2022 in PCT Application No. PCT/US2020/043459.

(56) References Cited

OTHER PUBLICATIONS

International Preliminary Report on Patentability dated Mar. 26, 2020 issued in Application No. PCT/US2018/050049.
International Preliminary Report on Patentability dated May 23, 2019 issued in Application No. PCT/US17/60692.
International Preliminary Report on Patentability dated May 23, 2019 issued in Application No. PCT/US2017/060240.
International Preliminary Report on Patentability dated May 26, 2020 issued in Application No. PCT/US2018/062301.
International Preliminary Report on Patentability dated Sep. 19, 2019 issued in Application No. PCT/US2018/021823.
International Search Report and Written Opinion dated Feb. 13, 2018 issued in Application No. PCT/US2017/060692.
International Search Report and Written Opinion dated Feb. 21, 2018 issued in Application No. PCT/US2017/060240.
International Search Report and Written Opinion dated Feb. 25, 2019 issued in Application No. PCT/US2018/050049.
International Search Report and Written Opinion dated Jan. 7, 2022, in Application No. PCT/US2021/051639.
International Search Report and Written Opinion dated Jun. 25, 2018 issued in Application No. PCT/US2018/021823.
International Search Report and Written Opinion dated Mar. 13, 2019 issued in Application No. PCT/US2018/062301.
International Search Report and Written Opinion dated Nov. 11, 2020 issued in Application No. PCT/US2020/043459.
Japanese Decision of Rejection dated Jan. 9, 2018 issued in Application No. JP 2013-007612.
Japanese First Office Action dated Dec. 1, 2020 issued in Application No. JP 2016-185454.
Japanese First Office Action dated May 28, 2019 issued in Application No. JP 2017-143195.
Japanese First Office Action dated May 29, 2019 issued in Application No. JP 2018-090402.
Japanese First Office Action dated Oct. 8, 2019 issued in Application No. JP 2015-184688.
Japanese Notice of Allowance dated Apr. 28, 2020 issued in Application No. JP 2015-184688.
Japanese Office Action dated Jan. 10, 2017 issued in Application No. JP 2013-007612.
Japanese Reason for Refusal dated Apr. 2, 2019 issued in Application No. JP 2013-007612.
Japanese Second Office Action dated Dec. 24, 2019 issued in Application No. JP 2017-143195.
Japanese Second Office Action [Decision of Rejection] dated Jan. 14, 2020 issued in Application No. JP 2018-090402.
Japanese Third Office Action dated Aug. 25, 2020 issued in Application No. JP 2017-143195.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Korean Decision from the Patent Tribunal of the KIPO (description) dated May 26, 2015 issued in Application No. KR 10-2012-0043797.
Korean Final Office Action dated Aug. 18, 2014 issued in Application No. KR 10-2012-0043797.
Korean First Office Action dated Nov. 27, 2019 issued in Application No. KR 10-2017-0093932.
Korean Notice of Provisional Rejection dated Dec. 6, 2013 issued in Application No. KR 10-2012-0043797.
Korean Second Office Action dated Oct. 27, 2020 issued in Application No. KR 10-2017-0093932.
KR Office Action dated Jan. 12, 2022 in Application No. KR1020150163065 with English translation.
KR Office Action dated Jan. 26, 2022, in Application No. KR1020197016749.
KR Office Action dated Nov. 30, 2021 in Application No. KR1020197017087 with English Translation.
KR Office Action dated Sep. 27, 2021, in application No. KR20210086044 with English translation.
KR Office Action dated Sep. 29, 2021, in application No. KR1020170109223 with English translation.
Kunnen et al., (2015) "A way to integrate multiple block layers for middle of line contact patterning," Proc. of SPIE, 9428:94280W1-8 [Downloaded on Jun. 27, 17 from http://proceedings.spiedigitallibrary.org].
Li et al. (2014) "Low Temperature (LT) Thermal ALD Silicon Dioxide Using Ozone Process," Arradiance Inc., Sudbury, MA USA, 1 page.
Lin et al., (1998) "Silicon Nitride Films Deposited by Atmospheric Pressure Chemical Vapor Deposition," Materials Research Society Symposium Proceedings vol. 495, Chemical Aspects of Electronic Ceramics Processing, Symposium held Nov. 30-Dec. 4, 1997, Boston, Massachusetts, U.S.A., 8 pages.
Liu et al. (Jun. 26-29, 2011) "High Rate Growth of SiO2 by Thermal ALD Using Tris(di-methylamino)silane and Ozone," ALD 2011, Cambridge NanoTech Inc., Cambridge, MA, USA, 14pp.
Ooba et al. (1998) "Self-Limiting Atomic-layer Selective Deposition of Silicon Nitride by Temperature-Controlled Method," Extended Abstracts of the 1998 International Conference on Solid State Devices and Materials, Hiroshima, pp. 22-23.
PCT International Preliminary Report on Patentability and Written Opinion, dated Oct. 26, 2012, issued in PCT/US2011/032303.
PCT International Search Report and Written Opinion, dated Feb. 20, 2012, issued in PCT/US2011/032303.
PCT Invitation to Pay Additional Fees; Communication Re Partial International Search, dated Dec. 16, 2011, issued in Application No. PCT/US2011/032303.
Plasma Enhanced Atomic Layer Deposition (PEALD), Website: http://www.asm.com/index.php?option=com_content&task=view&id=19&Itemid=161 (2010), 1 page.
"PlasmaProTM NGP®80 Range," Oxford Instruments (2010), 8 pages.
Putkonen et al. (2014) "Thermal and plasma enhanced atomic layer deposition of SiO2 using commercial silicon precursors," Thin Solid Films, 558:93-98.
Singapore 2nd Written Opinion dated Jan. 3, 2022 issued in Application No. SG 10201801817Q.
Singapore Notice of Eligibility for Grant and Supplemental Examination Report dated Jan. 20, 2020 issued in Application No. SG 10201507848X.
Singapore Search Report & Written Opinion dated Oct. 13, 2020 issued in Application No. SG 10201801817Q.
Singapore Search Report & Written Opinion dated Oct. 14, 2020 issued in Application No. SG 10201802228Y.
Singapore Search Report & Written Opinion dated Sep. 1, 2020 issued in Application No. SG 10201801141T.
Sundstrom, (Dec. 2005) "Ozone as the Oxidizing Precursor in Atomic Layer Deposition," Gas & Chemicals, MKS Instruments, Inc., Wilmington, MA, 4pp.
Taiwan Examination Report dated Mar. 29, 2017 issued in Application No. TW102102054.
Taiwan First Office Action dated Feb. 27, 2019, issued in Application No. TW 106124691.
Taiwan First Office Action dated Oct. 16, 2019 issued in Application No. TW 105109955.
Taiwanese First Decision of Refusal dated Dec. 22, 2020 issued in Application No. TW 1051305401.
Taiwanese First Office Action dated Apr. 25, 2019 issued in Application No. TW 104131344.
Taiwanese First Office Action dated Jun. 13, 2019 issued in Application No. TW104138370.
Taiwanese First Office Action dated Mar. 25, 2020 issued in Application No. TW 105130541.
Taiwanese Notice of Allowance dated Feb. 17, 2019 issued in Application No. TW 104138370.
U.S. Advisory Action dated May 20, 2019 issued in U.S. Appl. No. 15/349,746.
U.S. Appl. No. U.S. Appl. No. 16/852,261, inventors Abel et al., filed Apr. 17, 2020.
U.S. Appl. No. U.S. Appl. No. 17/632,074, inventors Gupta et al., filed Feb. 1, 2022.

(56) References Cited

OTHER PUBLICATIONS

U.S. Final Office Action dated Apr. 20, 2018 issued in U.S. Appl. No. 15/349,753.
U.S. Final Office Action dated Apr. 25, 2013 issued in U.S. Appl. No. 13/084,305.
U.S. Final Office Action dated Apr. 9, 2018 issued in U.S. Appl. No. 15/279,312.
U.S. Final Office Action dated Aug. 22, 2019 issued in U.S. Appl. No. 16/206,915.
U.S. Final Office Action dated Dec. 21, 2018 issued in U.S. Appl. No. 15/349,746.
U.S. Final Office Action dated Jan. 18, 2018 issued in U.S. Appl. No. 15/349,746.
U.S. Final Office Action dated Jan. 2, 2018 issued in U.S. Appl. No. 15/351,221.
U.S. Final Office Action dated Jan. 21, 2020 issued in U.S. Appl. No. 15/847,744.
U.S. Final Office Action dated Jun. 19, 2019, issued in U.S. Appl. No. 15/581,951.
U.S. Final Office Action dated May 3, 2018 issued in U.S. Appl. No. 15/432,634.
U.S. Final Office Action dated Nov. 14, 2014 issued in U.S. Appl. No. 14/065,334.
U.S. Final Office Action dated Oct. 19, 2017 issued in U.S. Appl. No. 15/279,314.
U.S. Notice of Allowance dated Apr. 25, 2018 issued in U.S. Appl. No. 15/253,546.
U.S. Notice of Allowance dated Aug. 18, 2015 issued in U.S. Appl. No. 14/494,914.
U.S. Notice of Allowance dated Dec. 11, 2019 issued in U.S. Appl. No. 15/279,312.
U.S. Notice of Allowance dated Dec. 16, 2019 issued in U.S. Appl. No. 16/206,915.
U.S. Notice of Allowance dated Dec. 5, 2018 issued in U.S. Appl. No. 15/703,917.
U.S. Notice of Allowance dated Feb. 1, 2016 issued in U.S. Appl. No. 14/552,245.
U.S. Notice of Allowance, dated Feb. 13, 2018, issued in U.S. Appl. No. 15/456,301.
U.S. Notice of Allowance dated Feb. 17, 2015 issued in U.S. Appl. No. 14/065,334.
U.S. Notice of Allowance dated Feb. 8, 2017 issued in U.S. Appl. No. 14/713,639.
U.S. Notice of Allowance dated Jan. 13, 2021, issued in U.S. Appl. No. 16/713,557.
U.S. Notice of Allowance dated Jan. 15, 2020 issued in U.S. Appl. No. 16/294,783.
U.S. Notice of Allowance dated Jul. 1, 2020 issued in U.S. Appl. No. 15/349,746.
U.S. Notice of Allowance dated Jul. 15, 2016 issued in U.S. Appl. No. 14/678,736.
U.S. Notice of Allowance dated Jul. 16, 2018 issued in U.S. Appl. No. 15/351,221.
U.S. Notice of Allowance, dated Jul. 24, 2019, issued in U.S. Appl. No. 15/878,349.
U.S. Notice of Allowance dated Jul. 26, 2013, issued U.S. Appl. No. 13/414,619.
U.S. Notice of Allowance dated Jul. 26, 2018 issued in U.S. Appl. No. 15/829,702.
U.S. Notice of Allowance dated Jun. 16, 2020 issued in U.S. Appl. No. 16/575,214.
U.S. Notice of Allowance dated Jun. 17, 2019 issued in U.S. Appl. No. 15/349,753.
U.S. Notice of Allowance dated Jun. 19, 2019 issued in U.S. Appl. No. 15/821,590.
U.S. Notice of Allowance, dated May 15, 2020, issued in U.S. Appl. No. 16/247,296.
U.S. Notice of Allowance dated May 28, 2020 issued in U.S. Appl. No. 15/847,744.
U.S. Notice of Allowance, dated Oct. 20, 2017, issued in U.S. Appl. No. 15/462,695.
U.S. Notice of Allowance, dated Oct. 23, 2017, issued in U.S. Appl. No. 15/456,301.
U.S. Notice of Allowance dated Oct. 26, 2016 issued in U.S. Appl. No. 14/552,245.
U.S. Notice of Allowance dated Oct. 3, 2019 issued in U.S. Appl. No. 15/581,951.
U.S. Notice of Allowance, dated Oct. 5, 2018, issued in U.S. Appl. No. 15/453,815.
U.S. Notice of Allowance dated Sep. 1, 2017 issued in U.S. Appl. No. 15/272,222.
U.S. Notice of Allowance dated Sep. 19, 2016 issued in U.S. Appl. No. 14/935,317.
U.S. Notice of Allowance dated Sep. 22, 2020 issued in U.S. Appl. No. 16/820,431.
U.S. Notice of Allowance, dated Sep. 25, 2018, issued in U.S. Appl. No. 15/975,554.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Notice of Allowance dated Sep. 6, 2018 issued in U.S. Appl. No. 15/432,634.
U.S. Office Action dated Apr. 11, 2014 issued in U.S. Appl. No. 14/065,334.
U.S. Office Action dated Apr. 18, 2016 issued in U.S. Appl. No. 14/935,317.
U.S. Office Action dated Apr. 18, 2019 issued in U.S. Appl. No. 15/279,312.
U.S. Office Action dated Apr. 7, 2017 issued in U.S. Appl. No. 15/279,314.
U.S. Office Action, dated Feb. 25, 2019, issued in U.S. Appl. No. 15/878,349.
U.S. Office Action dated Feb. 26, 2019 issued in U.S. Appl. No. 16/206,915.
U.S. Office Action, dated Feb. 8, 2018, issued in U.S. Appl. No. 15/453,815.
U.S. Office Action dated Jul. 10, 2020, issued in U.S. Appl. No. 16/713,557.
U.S. Office Action dated Jul. 14, 2017 issued in U.S. Appl. No. 15/349,746.
U.S. Office Action dated Jul. 18, 2018 issued in U.S. Appl. No. 15/703,917.
U.S. Office Action dated Jul. 30, 2019 issued in U.S. Appl. No. 15/847,744.
U.S. Office Action dated Jul. 5, 2017 issued in U.S. Appl. No. 15/351,221.
U.S. Office Action dated Jun. 14, 2019 issued in U.S. Appl. No. 15/349,746.
U.S. Office Action dated Jun. 29, 2017 issued in U.S. Appl. No. 15/279,312.
U.S. Office Action dated Jun. 29, 2018 issued in U.S. Appl. No. 15/349,746.
U.S. Office Action dated Jun. 7, 2013 issued U.S. Appl. No. 13/414,619.
U.S. Office Action dated May 19, 2017 issued in U.S. Appl. No. 15/272,222.
U.S. Office Action dated May 24, 2016 issued in U.S. Appl. No. 14/552,245.
U.S. Office Action dated May 25, 2016 issued in U.S. Appl. No. 14/552,011.
U.S. Office Action dated May 29, 2020 issued in U.S. Appl. No. 16/820,431.
U.S. Office Action, dated Nov. 1, 2018, issued in U.S. Appl. No. 15/581,951.
U.S. Office Action, dated Nov. 16, 2017, issued in U.S. Appl. No. 15/432,634.
U.S. Office Action dated Oct. 1, 2015 issued in U.S. Appl. No. 14/552,245.
U.S. Office Action dated Oct. 23, 2017 issued in U.S. Appl. No. 15/349,753.

(56) References Cited

OTHER PUBLICATIONS

U.S. Office Action, dated Oct. 3, 2019, issued in U.S. Appl. No. 16/247,296.
U.S. Office Action dated Oct. 6, 2017 issued in U.S. Appl. No. 15/253,546.
U.S. Office Action dated Sep. 14, 2012 issued in U.S. Appl. No. 13/084,305.
U.S. Office Action dated Sep. 28, 2018 issued in U.S. Appl. No. 15/349,753.
Wikipedia, The Free Encyclopedia, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
Yokoyama et al. (1998) "Atomic-layer selective deposition of silicon nitride on hydrogen-terminated Si surfaces," Applied Surface Science, 130-132, 352-356.

\* cited by examiner

SELECTIVE DEPOSITION USING HYDROLYSIS

INCORPORATION BY REFERENCE

A Request Form is filed concurrently with this specification as part of the present application. Each application that the present application claims benefit of or priority to as identified in the concurrently filed Request Form is incorporated by reference herein in their entireties and for all purposes.

BACKGROUND

Semiconductor device fabrication includes fabrication of microprocessors, logic, and memory devices. Such devices may be fabricated using a variety of techniques, including self-aligned patterning such as double patterning or quad patterning, gapfill processes, and other techniques. Some processes involve formation of structures that include silicon oxide and metal, such as copper. Conventional techniques for forming such structures may be limited.

SUMMARY

Provided are methods of processing substrates. One aspect involves a method of selectively depositing metal oxide on an exposed metal surface relative to a dielectric material on a substrate, the method including: (a) providing the substrate including the dielectric material and the exposed metal surface; (b) prior to depositing the metal oxide, exposing the substrate to a blocking reagent to non-selectively adsorb the blocking reagent onto both the dielectric material and the exposed metal surface; (c) after exposing the substrate to the blocking reagent and prior to depositing the metal oxide, selectively removing the blocking reagent from the exposed metal surface; and (d) selectively depositing the metal oxide on the exposed metal surface relative to the dielectric material on the substrate.

In various embodiments, selectively removing the blocking reagent is performed by contacting the substrate with water. In some embodiments, selectively removing the blocking reagent is performed by dipping the substrate in water.

In various embodiments, the blocking reagent is a silicon amide.

In various embodiments, the blocking reagent is an alkylchlorosilane. An example alkylchlorosilane has a chemical structure of $Cl_xSi([CH_3(CH_2)_y])_{(4-x)}$, where x is an integer between and including 1 and 3, and y is an integer greater than or equal to 1.

In various embodiments, the blocking reagent is an alkylaminosilane. An example alkylaminosilane has a chemical structure of $[(CH_3)_xN]_xSi([CH_3(CH_2)_y])_{(4-x)}$, where x is an integer between and including 1 and 3, and y is an integer greater than or equal to 1.

In various embodiments, the blocking reagent is provided in an aprotic polar solvent.

The blocking reagent may form a hydrolyzable bond with the exposed metal surface but does not form a hydrolyzable bond with the dielectric material.

The substrate may be exposed to the blocking reagent by dipping the substrate in a wet solution of the blocking reagent. In some embodiments, the substrate is exposed to the blocking reagent at a temperature between about 25° C. and about 100° C.

In some embodiments, the substrate is exposed to the blocking reagent at a temperature between about 60° C. and about 100° C.

In various embodiments, the substrate is exposed to the blocking reagent by introducing the blocking reagent in vapor phase. In some embodiments, the substrate is exposed to the blocking reagent at a temperature between about 100° C. and about 300° C.

In some embodiments, the substrate is exposed to the blocking reagent at a temperature between about 200° C. and about 250° C.

In various embodiments, the substrate is exposed to the blocking reagent for a duration between about 10 seconds and about 60 seconds.

In various embodiments, selectively removing the blocking reagent the substrate is performed at room temperature.

Selectively removing the blocking reagent the substrate may selectively hydrolyze bonds between the blocking reagent and the exposed metal surface.

In various embodiments, the metal oxide deposited is alumina.

In various embodiments, the metal oxide is selectively deposited on the exposed metal surface relative to the dielectric material using atomic layer deposition.

In various embodiments, the exposed metal surface comprises a metal selected from the group consisting of tungsten, titanium, and aluminum.

In various embodiments, the dielectric material comprises silicon. In some embodiments, the dielectric material is selected from the group consisting of silicon oxide, silicon nitride, carbon doped silicon oxide.

In various embodiments, the substrate is patterned.

In various embodiments, the hydrolyzing results in the exposed metal surface having a hydrogen terminated and/or hydroxyl terminated surface.

Another aspect involves a method of selectively depositing metal oxide on an exposed metal surface relative to a dielectric material on a substrate, the method including: (a) providing the substrate including the dielectric material and the exposed metal surface; (b) prior to depositing the metal oxide, exposing the substrate to a blocking reagent to non-selectively adsorb the blocking reagent onto both the dielectric material and the exposed metal surface; (c) after exposing the substrate to the blocking reagent and prior to depositing the metal oxide, contacting substrate with water to selectively remove the blocking reagent from the exposed metal surface; and (d) selectively depositing the metal oxide on the exposed metal surface relative to the dielectric material on the substrate.

These and other aspects are described further below with reference to the drawings.

DETAILED DESCRIPTION

Figure 1:
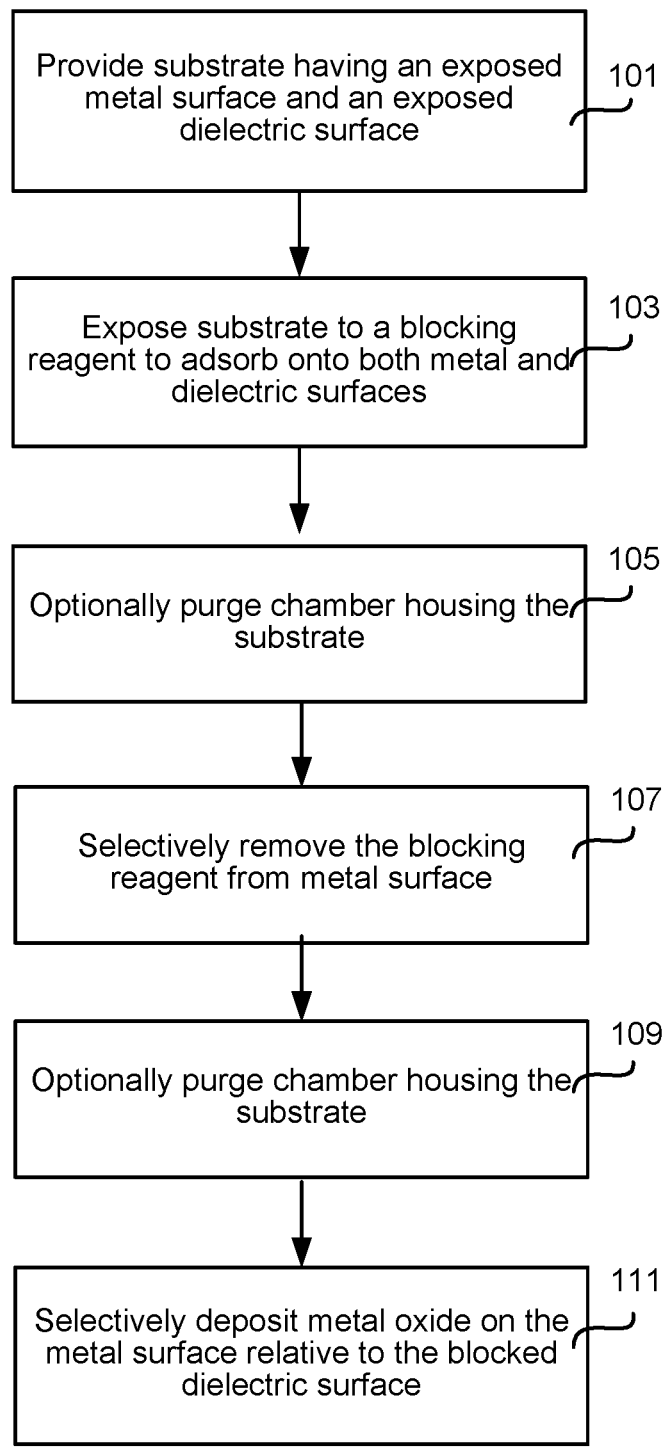
FIG. 1 is a process flow diagram depicting operations for performing a method.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor manufacturing processes often involve deposition and etching of various materials in a patterning scheme to form specific types of semiconductor devices. Selective deposition of metal oxide films on a dielectric surface in the presence of a metal surface can be achieved, such as by depositing aluminum oxide by atomic layer deposition (ALD) on silicon oxide in the presence of a copper surface. However, the opposite process of selectively depositing a dielectric by ALD on a metal surface in the presence of a silicon oxide surface faces challenges—in particular, the lack of selective inhibitor molecules shifts techniques to other masking techniques rather than using selective deposition techniques. For example, selectively depositing aluminum oxide by ALD on a copper surface in the presence of an exposed silicon oxide surface can be challenging.

Provided herein are methods of selectively depositing material on a metal surface relative to a dielectric surface. Certain disclosed embodiments involve utilizing the reactivity of a metal-oxygen-silicon (M—O—Si) bond versus a silicon-oxygen-silicon (Si—O—Si) bond in water to achieve selective removal of a blocking reagent from a metal surface while blocking reagent remains on a dielectric surface. Certain disclosed embodiments may be particularly suitable for selectively depositing dielectric on metal relative to dielectric surfaces.

For example, disclosed embodiments may involve depositing silicon oxide (e.g., $SiO_2$), silicon nitride (SiN), carbon-doped silicon nitride, aluminum oxide ($Al_2O_3$), silicon oxycarbides, silicon carbonitrides, and silicon oxycarbonitrides on metal-containing surfaces such as metal surfaces or metal alloy surfaces. Example metals include tungsten, titanium, aluminum, and copper. A non-limiting example of a silicon oxycarbide is a silicon oxycarbide having the chemical formula $SiO_xC_y$, where $2x+4y=4$ (x and y need not be integers). A non-limiting example of a silicon carbonitride is a silicon carbonitride having the chemical formula $SiC_aN_b$ where $4a+3b=4$ (x and y need not be integers). A non-limiting example of a silicon oxycarbonitride is a silicon oxycarbonitride having the chemical formula $SiO_iC_jN_k$ where $2i+4j+3k=4$.

Techniques described herein may involve thermal atomic layer deposition (ALD) and/or plasma-enhanced atomic layer deposition (PEALD). That is, in various embodiments, the reaction between a silicon-containing precursor and an oxidizing agent to form silicon oxide is performed.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a silicon oxide deposition cycle may include the following operations: (i) delivery/adsorption of a silicon-containing precursor, (ii) purging of the silicon precursor from the chamber, (iii) delivery of an oxygen-containing reactant or oxygen-containing gas, and (iv) purging of the oxygen-containing reactant from the chamber. In a PEALD process, delivery of the oxygen-containing reactant may be accompanied by generation of a plasma in the oxygen-containing reactant environment.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as an oxygen-containing reactant, is introduced to the chamber so that some of these molecules react with the first precursor adsorbed on the surface. In some processes, the second reactant reacts immediately with the adsorbed first precursor. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

Selective blocking of one surface relative to another can be achieved using a two-step process. The first operation is non-selective adsorption of an inhibitor molecule. The second operation is selective removal of the inhibitor molecule from one surface via a wet etch using pure water or another hydrolyzing agent which hydrolyzes the chemical bond attaching the inhibitor molecule to one surface and not the other. This method may be performed such that one surface is silicon-based and the other is metal-based. The deposition method to be used after net-inhibition may be atomic layer deposition of a metal oxide film.

Selective deposition of metal oxide films on a dielectric surface in the presence of a metal surface may be performed using deposition of ALD alumina on a dielectric such as silicon oxide in the presence of a tungsten or copper or other metal surface. However, inhibitors used in selective deposition to deposit on dielectric may not be selective to the metal surface due to the hydroxyl termination found on typical dielectric surfaces.

Certain disclosed embodiments involve the opposite; selective deposition of ALD alumina on a tungsten or copper or other metal surface in the presence of a dielectric surface.

Some ALD dielectric deposition involves a metal organic precursor (tri-methyl-aluminum or tetrakis (dimethylamido) zirconium for example) and water to deposit a film. An ALD cycle may include an exposure of the metal organic precursor to the surface where native hydroxyls or oxide species react with the precursor to form surface-oxygen-metal bonds displacing one of the metal organic ligands as either an amine (e.g. $HN(CH_3)_2$) or as a hydrocarbon (e.g. $CH_4$). A method to block deposition on a surface is to eliminate these reactive hydroxyls/oxides (surface-OH or surface=O) and replace them with hydrocarbon termination (surface —CxHy). Regents such as silicon amides (e.g. $Si(CH_3)_3(NMe_2)$) readily perform this reaction but are non-selective.

One solution to this problem of non-selectivity is to eliminate the oxides on the metal surface via reduction such as described elsewhere herein. This method involves selective deposition on the dielectric and not on the metal.

To achieve selective deposition on the metal and not on the dielectric, one embodiment involves non-selectively reacting alkylation reagents such as silicon amides to both dielectric and metal surfaces and then selectively removing the reagent to form the metal surface using water. Water readily hydrolyzes the bond between the inhibitor and the metal surface (e.g. $M-O-Si(CH_3)_3 + H_2O \rightarrow M-OH + HO-Si(CH_3)_3$) but does not readily cause the same reaction on the dielectric surface.

Selective growth of metal oxide on a metal surface and not on a dielectric surface can be performed by selectively blocking the dielectric surface using certain disclosed embodiments.

FIG. 1 provides a process flow diagram depicting operations in a method performed in accordance with certain disclosed embodiments. Processing temperatures that may be suitable for certain disclosed embodiments depend on the technique used for each operation. Some embodiments for some operations described herein may be performed at temperatures between about 70° C. and about 200° C., or between about 100° C. and about 150° C.

In operation 101, a substrate having an exposed metal surface and an exposed dielectric surface is provided. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers; materials include but are not limited to silicon oxides, silicon nitrides, silicon carbides, metal oxides, metal nitrides, metal carbides, and metals. The substrate may be patterned in some embodiments. The substrate may not be patterned in some embodiments. In some embodiments, the substrate includes a dielectric material and vias filled with a metal (such as interconnect lines).

In various embodiments, the dielectric material may be a silicon-containing material, such as silicon oxide, silicon nitride, carbon-doped silicon oxide, or combinations thereof. In various embodiments, the dielectric material may be an ultra-low k (ULK) dielectric. In some embodiments, the dielectric material may be a semiconductor material instead of a dielectric material. In various embodiments, the dielectric layer includes hydroxyl-terminated silicon oxide.

In various embodiments, the exposed metal surface includes one or more of the following metals or its alloys: tungsten, aluminum, titanium, titanium aluminum, and combinations thereof.

In some embodiments, the substrate is patterned with vias which are filled with a metal such as copper. In some embodiments, the vias are filled with copper oxides, ruthenium, and/or ruthenium oxides. In some embodiments, the copper is reduced using exposure to a reducing agent such as hydrogen or hydrazine to prepare the service for subsequent operations.

Figure 2A:
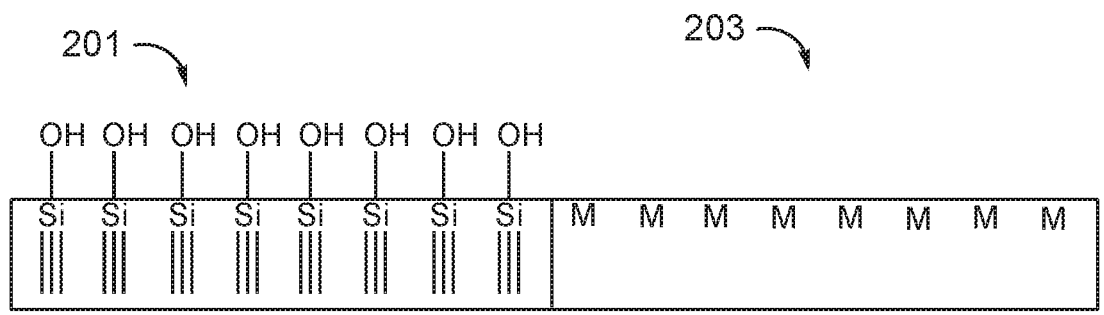
FIGS. 2A-2E are schematic diagrams of an example of a mechanism for selectively depositing material on an exposed metal surface relative to a dielectric surface in accordance with certain disclosed embodiments.

FIG. 2A is a schematic illustration of an example substrate having an exposed silicon oxide surface 201 and an exposed metal surface 203.

Returning to FIG. 1, in operation 103, the substrate is exposed to a blocking reagent that adsorbs, or deposits onto both the metal and dielectric surfaces, regardless of surface chemistry or topography. In some embodiments, a blocking reagent both adsorbs and deposits onto the metal and dielectric surfaces.

Figure 2B:
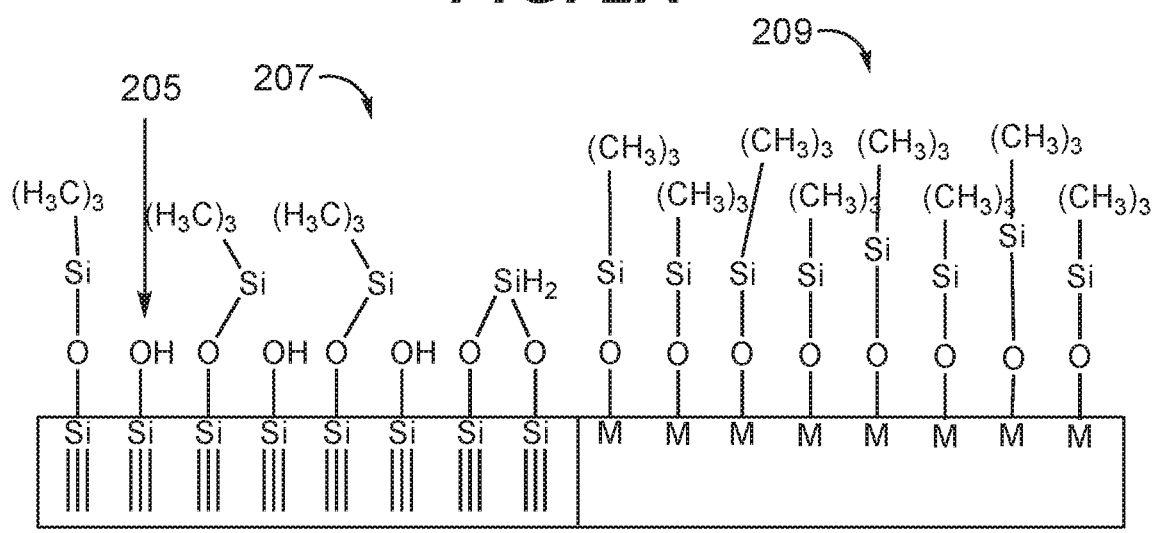

FIG. 2B is a schematic illustration of an example substrate having an exposed silicon oxide surface 201 and exposed metal surface 203 where the blocking reagent adsorbs onto both surfaces to form blocked surface 205 having adsorbed blocking reagent 207 having Si—O—Si bonds on the dielectric and adsorbed blocking reagent 209 having M-O—Si bonds on the metal.

It will be understood that although a flat surface is depicted in this figure, certain disclosed embodiments may be applicable to surfaces having topography including features of various sizes and heights. Example features include holes, trenches, vias, and other features. The substrate is exposed to a blocking reagent which reacts with both the exposed metal surface and dielectric material. The blocking reagent may be one or more alkylation reagents such as silicon amides. The blocking reagent is reactive with both dielectric and metal surfaces alike, but are removable from metal surfaces using hydrolysis and not removable from dielectric surfaces using hydrolysis.

The blocking reagent may be any chemical compound capable of forming a hydrolyzable bond with a metal surface and a nonhydrolyzable bond with a dielectric surface. In various embodiments, the blocking reagent forms a hydrolyzable bond with metal. In various embodiments, the blocking reagent is capable of forming a metal-oxygen-silicon bond with the metal, and is capable of forming a silicon-oxygen-silicon bond with a silicon-containing dielectric material.

Example blocking reagents include alkylaminosilanes, and alkylchlorosilanes. Alkylaminosilanes may be used in some embodiments because resulting byproducts from later hydrolysis and selective deposition on metal yields byproducts that may be less damaging to surfaces of the semiconductor substrate as compared to byproducts of hydrolysis involving alkylchlorosilanes, which may form hydrogen chloride (HCl) which is potentially damaging to surfaces of the substrate.

A suitable alkylaminosilane can have the general chemical formula of $[(CH_3)_2N]_xSi([CH_3(CH_2)_y])_{(4-x)}$, where x is an integer between and including 1 and 3, and y is any integer greater than or equal to 1.

A suitable alkylchlorosilane can have the general chemical formula of $Cl_xSi([CH_3(CH_2)_y])_{(4-x)}$, where x is an integer between and including 1 and 3, and y is any integer greater than or equal to 1.

One example alkylchlorosilane that may be used is dimethyldichlorosilane.

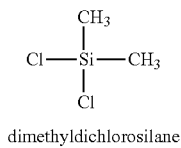

dimethyldichlorosilane

Exposure to the blocking reagent may be performed using one of the following techniques: a wet technique and a dry technique. A wet technique may involve dipping the substrate in a solution having the blocking reagent therein to expose the surfaces of the substrate to the blocking reagent or using a spin coater to deliver the solution having the blocking reagent to the surface of the substrate.

Where an alkylaminosilane or alkylchlorosilane is used as the blocking reagent, the solution having the blocking reagent is a nonaqueous polar solvent. The solvent may be an aprotic polar solvent in various embodiments. Examples of solvents for an alkylaminosilane that may be suitable include dimethylformamide (DMF), diethylether, and acetylnitrile:

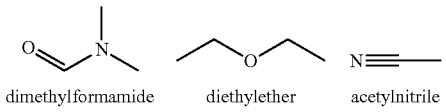

dimethylformamide   diethylether   acetylnitrile

An example of a solvent for an alkylchlorosilane includes propylene glycol methyl ether (PGME):

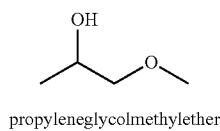

propyleneglycolmethylether

Other potential solvents include alcohols.

A dry technique may involve preparing the blocking reagent in a vapor or gas phase and delivering the vapor phase or gas phase blocking reagent to a chamber housing the substrate to expose the substrate surface to the blocking reagent.

Suitable temperatures that may be used for this operation depend on the technique selected and is limited by thermal decomposition of the blocking reagent. For the wet technique, the solution may be heated or cooled to a temperature of about room temperature, or about 25° C., or at least about room temperature, or at least about 60° C., or between about 25° C. and about 100° C., or between about 60° C. and about 100° C. For the dry technique, the substrate may be held on a pedestal set to a temperature of a temperature greater than that for which thermal decomposition of the blocking reagent occurs. In various embodiments, the temperature may be between about 100° C. and about 300° C., or between about 200° C. and about 250° C.

Operation 103 may be performed for a duration between about 10 seconds and about 60 seconds.

Returning to FIG. 1, in operation 105, a chamber housing the substrate may be optionally purged to remove excess blocking reagent. Purging the chamber may involve flowing a purge gas or a sweep gas, which may be a carrier gas used in other operations or may be a different gas. In some embodiments, purging may involve evacuating the chamber. However, in some embodiments, the chamber is not evacuated. Example purge gases include, but are not limited to, argon, nitrogen, hydrogen, and helium. In some embodiments, operation 105 may include one or more evacuation subphases for evacuating the process chamber. Alternatively, it will be appreciated that operation 105 may be omitted in some embodiments. Operation 105 may have any suitable duration, such as between about 0 seconds and about 60 seconds, for example about 0.01 seconds. In some embodiments, increasing a flow rate of one or more purge gases may decrease the duration of operation 105. For example, a purge gas flow rate may be adjusted according to various reactant thermodynamic characteristics and/or geometric characteristics of the process chamber and/or process chamber plumbing for modifying the duration of operation 105. In one non-limiting example, the duration of a purge phase may be adjusted by modulating purge gas flow rate. This may reduce deposition cycle time, which may improve substrate throughput. After a purge, the blocking reagent remains adsorbed onto both the metal and dielectric surfaces.

In operation 107, the blocking reagent is selectively removed from the metal surface. In some embodiments, this operation involves contacting the substrate with water. In various embodiments, contacting the substrate with water may be performed by dipping the substrate in water, or delivering water to the surface of the substrate. In various embodiments, the substrate surface is hydrolyzed to selectively remove the blocking reagent from the metal surface relative to the dielectric material such that the blocking reagent remains on the dielectric material and the metal surface is exposed. Hydrolyzing can be performed by dipping the substrate in a container of water. Operation 107 may be performed at room temperature. Hydrolyzing is not performed using water vapor or gas phase techniques. In some embodiments, an aqueous hydrolysis technique is used.

Hydrolyzing may be performed at room temperature or any temperature greater than room temperature. Dipping the substrate at room temperature hydrolyzes the blocking reagent, thereby cleaving the metal-oxygen-silicon bond on metal surfaces in a matter of seconds. Since the silicon-oxygen-silicon bonds are not hydrolyzable and not reactive with water, the blocking reagent remains on dielectric surfaces, thereby resulting in a substrate having blocking reagent selectively on dielectric material relative to exposed metal surfaces.

Without being bound by a particular theory, it is believed that dipping in water results in a hydrogen-terminated or hydroxyl-terminated metal surface, which is susceptible to subsequent deposition while the blocking reagent that remains on the dielectric surface is not susceptible to subsequent deposition.

In operation 807-818, metal oxide (such as alumina) may be selectively deposited onto the exposed metal surface relative to the dielectric surface. For example, ALD may be performed whereby the deposition precursor selectively adsorbs onto the exposed metal surface and an oxidant is used to selectively form metal oxide on the exposed metal surface. For example, alumina deposited by ALD may involve using a deposition precursor such as trimethylaluminum.

Figure 2C:
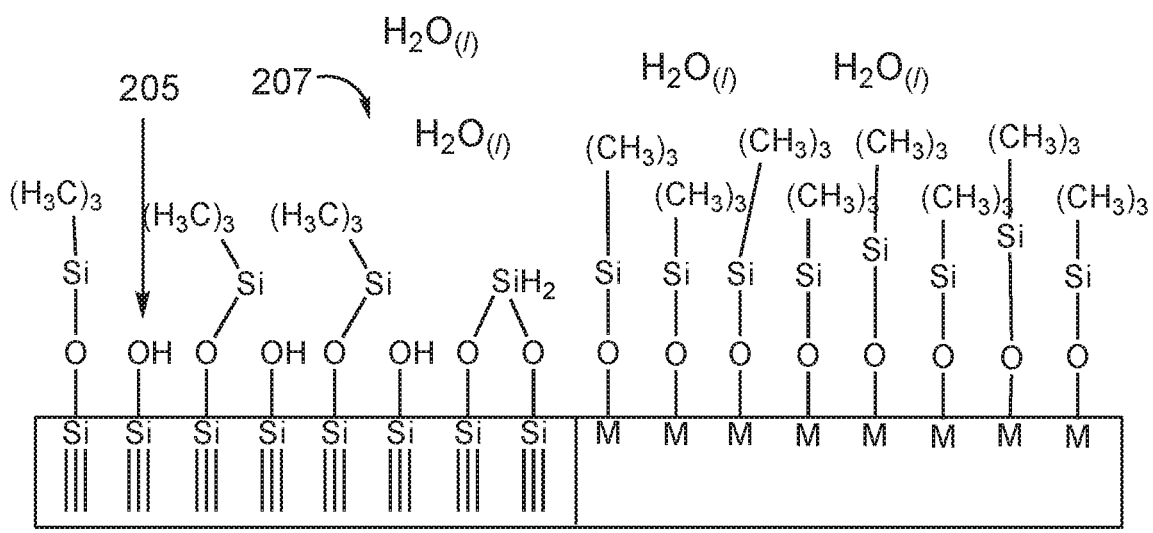

FIG. 2C is a schematic illustration of an example substrate whereby water is introduced to the substrate having adsorbed blocked surface 205 having adsorbed blocking reagent 207 having Si—O—Si bonds on the dielectric and adsorbed blocking reagent 209 having M-O—Si bonds on the metal.

Figure 2D:
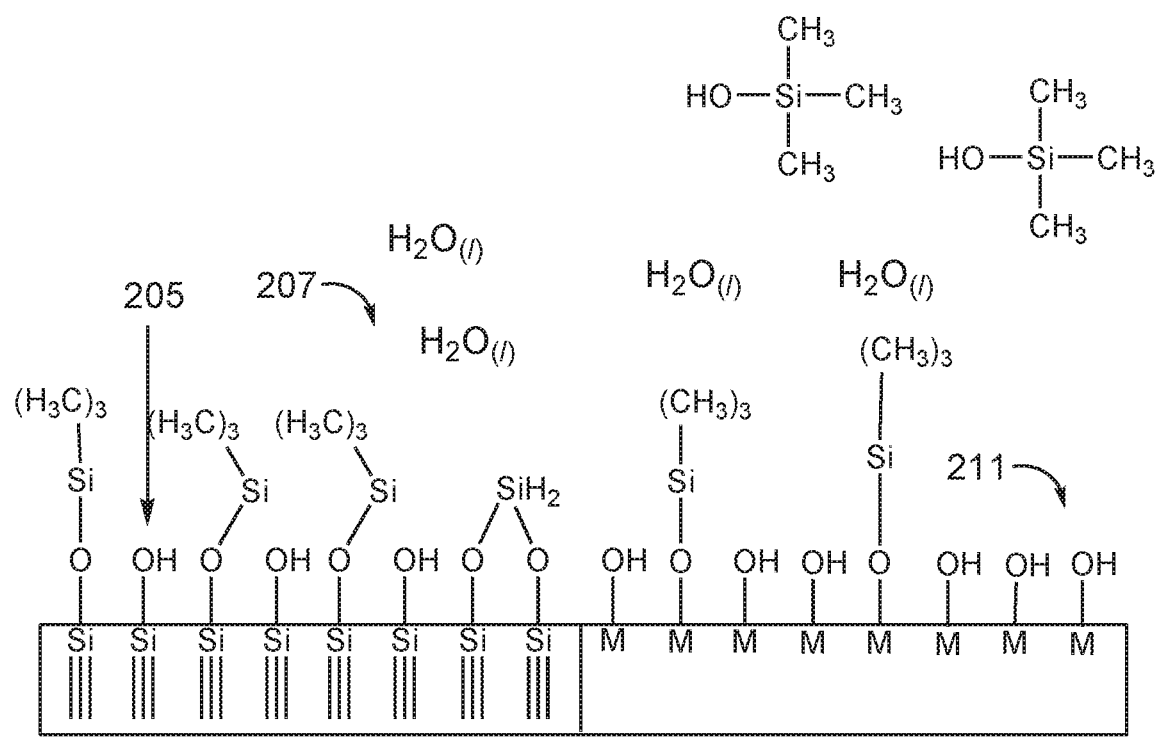

FIG. 2D is a schematic illustration of an example substrate whereby hydrogen cleaves the hydrolyzable bonds between the blocking reagent 209 on the metal and the metal surface, resulting in a hydroxyl-terminated metal surface 211.

Figure 2E:
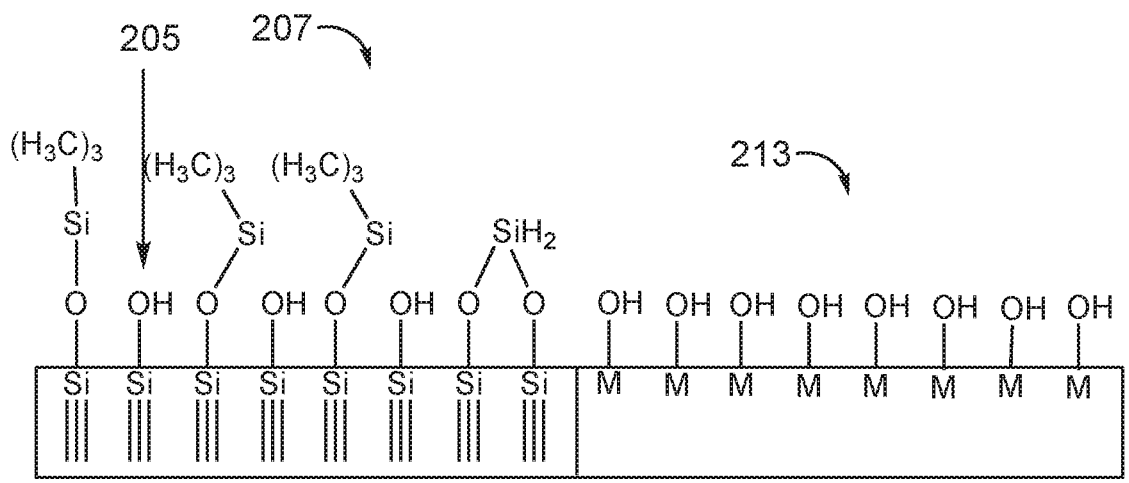

FIG. 2E is a schematic illustration of an example substrate whereby adsorbed blocking reagent is removed from the metal surface by hydrolysis while the adsorbed blocking reagent 207 remains on the dielectric surface, resulting in hydroxyl-terminated metal surface 213, which is ready for deposition of, for example, a metal oxide material.

Figure 3:
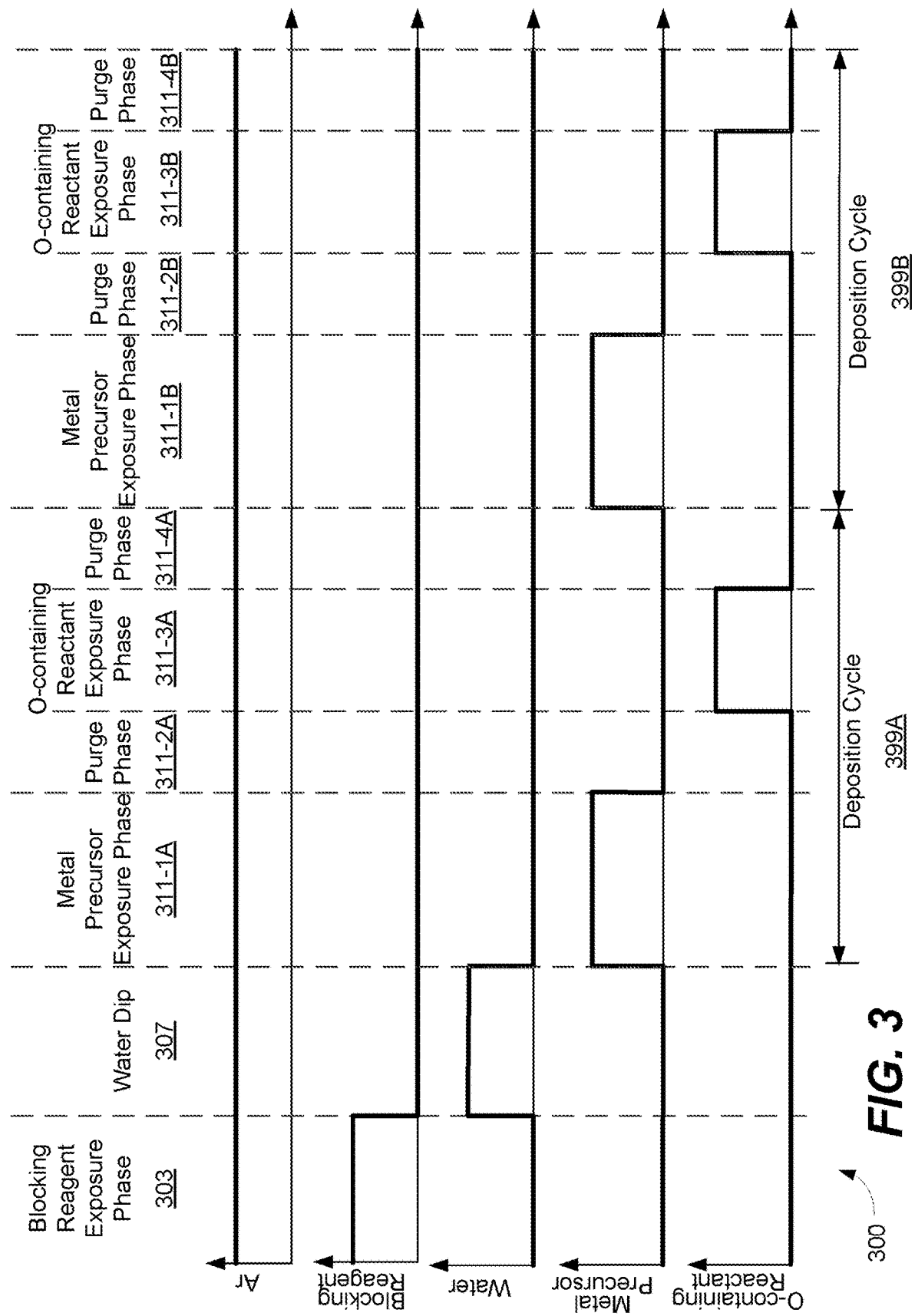
FIG. 3 is a timing sequence diagram showing an example of cycles in a method in accordance with certain disclosed embodiments.

FIG. 3 provides a timing schematic diagram of various operations performed in accordance with certain disclosed embodiments. Although process 300 depicted in FIG. 3 includes only two deposition cycles 399A and 399B, it will be understood that more than two deposition cycles (and in some cases, only one deposition cycle) may be performed in certain disclosed embodiments.

FIG. 3 shows phases in an example deposition process 300, for various process parameters, such as flow of argon as a carrier gas and/or purge gas, blocking reagent gas flow, water flow (used herein as a dip process, not a gaseous process), metal precursor gas flow, oxygen-containing reactant exposure, and reducing agent gas flow. Although the example depicts ALD using an oxygen-containing reactant as the deposition technique and plasma is not depicted in FIG. 3, in some embodiments an oxygen-containing plasma may be used to deposit metal oxide such that plasma is generated when oxygen-containing reactant is flowed. The lines in FIG. 3 indicate when the flow is turned on and off and when the water dip is performed. Various disclosed embodiments depend on process parameters that include, but are not limited to, flow rates for inert, blocking reagent, and reactant species, flow rates for argon as a carrier gas, metal precursor, and oxygen-containing gases, substrate temperature, and process chamber pressure.

As depicted in FIG. 3, prior to selective deposition, a blocking reagent exposure phase 303 is performed whereby blocking reagent is delivered, while metal precursor and oxygen-containing reactant flows are off. The blocking reagent can be delivered using argon gas in this example. Water is not used; it will be understood that water as depicted in FIG. 3 refers to dipping the substrate in water, not introducing water in gas or vapor phase. This may correspond to operation 103 of FIG. 1.

Water dip 307 is performed whereby the substrate is dipped in an aqueous bath of water. It will be understood that this may be performed in a matter of seconds and may be performed at room temperature. In some cases, this may be performed at a higher temperature, but dipping the wafer at room temperature can achieve a quick hydrolysis reaction in a few seconds without substantially prolonging the overall process time. Although argon is depicted as being in an "on" phase, the substrate may be taken out of a chamber to be dipped and then subsequently placed back into a chamber. This may correspond to operation 107 of FIG. 1.

Deposition cycle 339A may correspond to operation 111 of FIG. 1. In some embodiments, deposition cycle 339 includes a cyclic deposition process as depicted in FIG. 3. Deposition cycle 399A includes metal precursor exposure phase 311-1A, purge phase 311-2A, oxygen-containing reactant exposure phase 311-3A, and purge phase 311-4A. During silicon-containing precursor exposure phase 311-1A, argon flow may be on to assist delivery of the metal precursor, while blocking reagent flow is off, metal precursor flow is on, and oxygen-containing reactant flow is off. In purge phase 311-2A, all gas flows and plasmas are off except argon gas flow, which acts as a purge gas. In oxygen-containing reactant exposure phase 311-3A, argon flow may continue to be on, blocking reagent flow is off, metal precursor gas flow is off, and oxygen-containing reactant flow is on. In purge phase 311-4A, argon flow is on to act as a purge gas, while blocking reagent flow is off, metal precursor gas flow is off, and oxygen-containing reactant flow is off. In this example, it is determined that metal oxide is not deposited to the desired thickness, so the operations are repeated in deposition cycle 399B. Deposition cycle 399B metal precursor exposure phase 311-1B, where only argon and metal precursor gas flows are on while blocking reagent gas flow, and oxygen-containing reactant gas flow are off; purge phase 311-2B whereby only argon is flowed as a purge gas; oxygen-containing reactant exposure phase 311-3B whereby only argon and oxygen-containing reactant are on while blocking reagent, and metal precursor gas flows are off; and purge phase 311-4B whereby argon is flowed as a purge gas.

Apparatus

Figure 4:
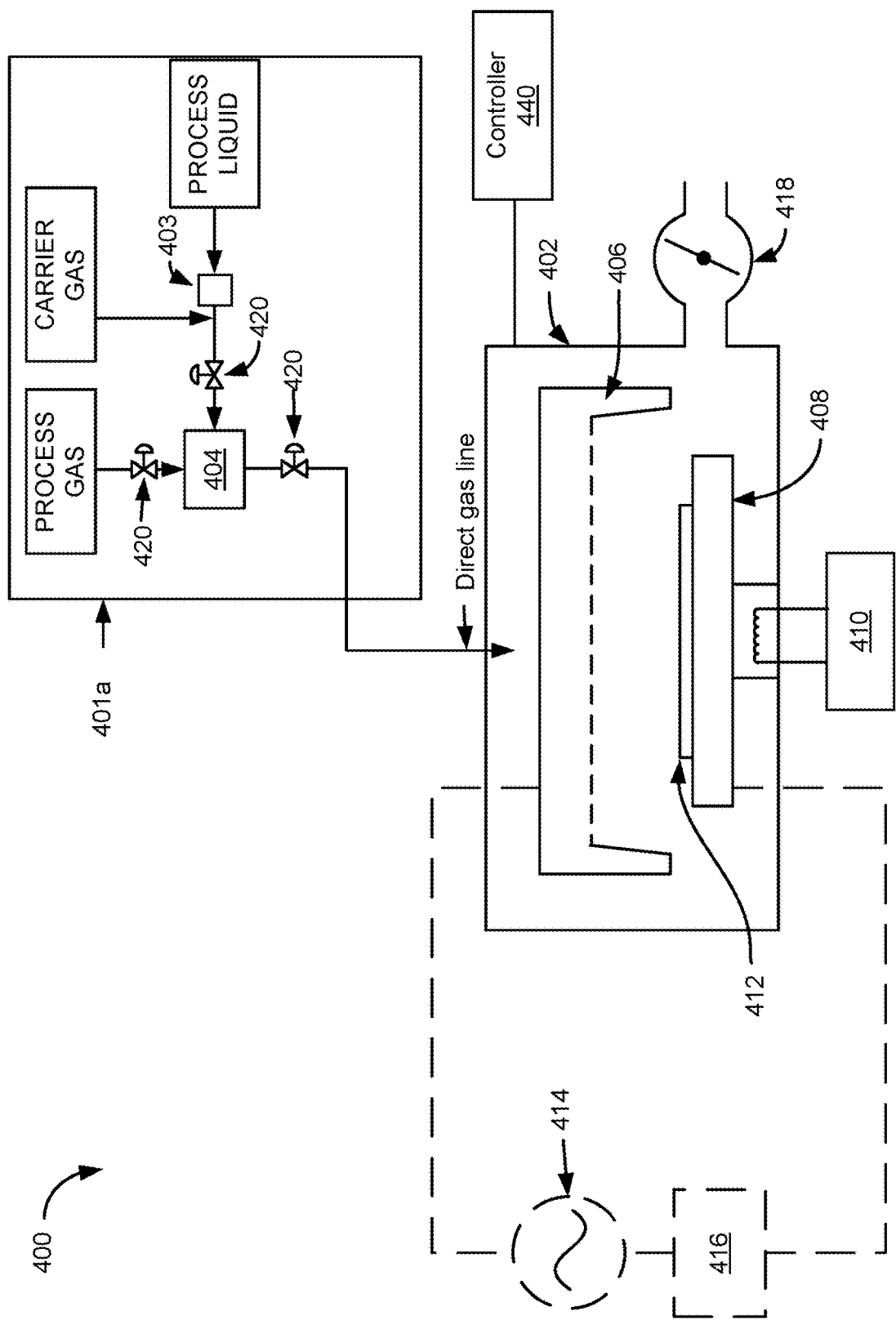
FIG. 4 is a schematic diagram of an example process chamber for performing disclosed embodiments.

FIG. 4 depicts a schematic illustration of an embodiment of an atomic layer deposition (ALD) process station 400 having a process chamber body 402 for maintaining a low-pressure environment. Such tool may be used to deliver a blocking reagent as well as to deposit a metal oxide film after dipping the substrate having the blocking reagent in water.

Figure 5:
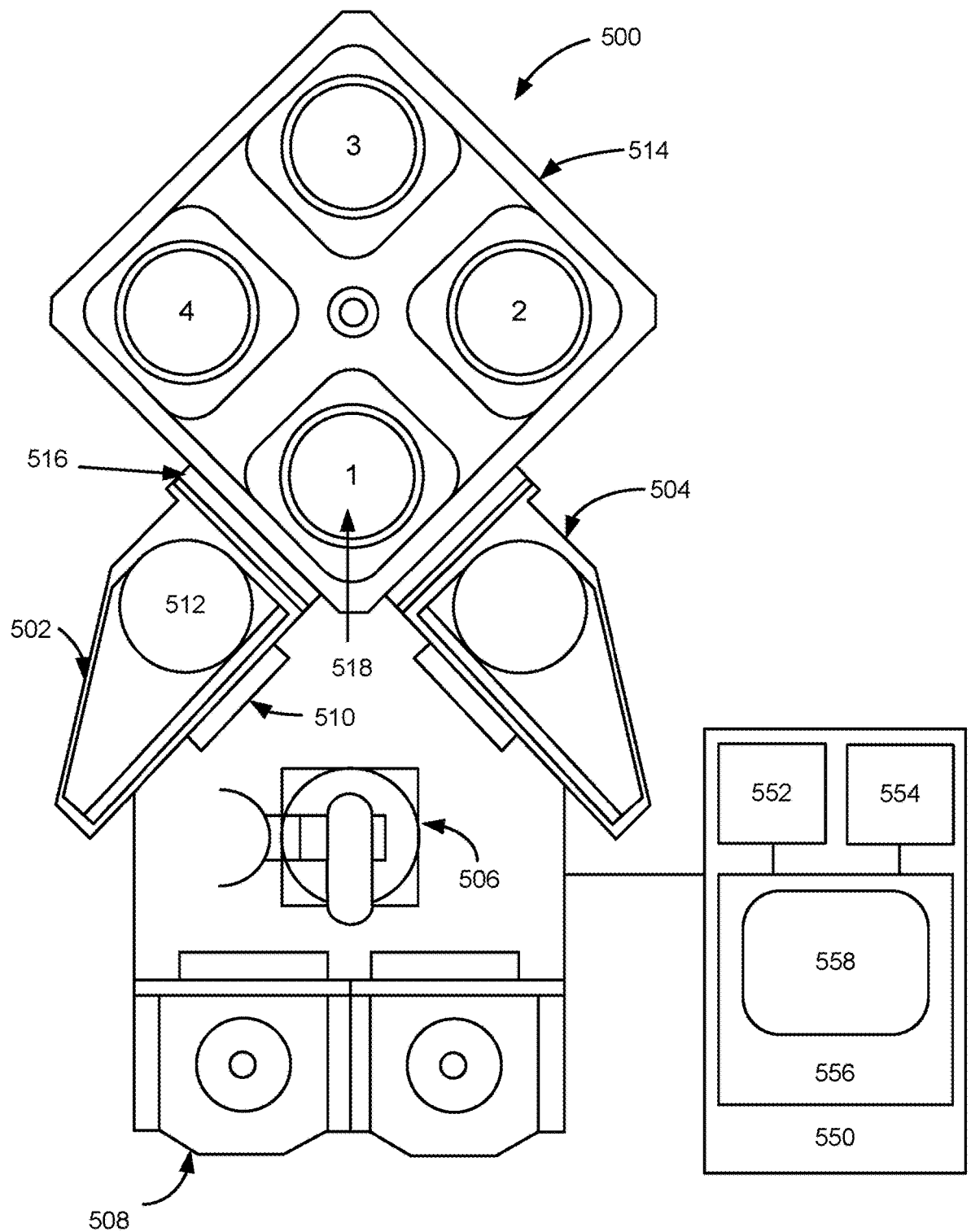
FIG. 5 is a schematic diagram of an example process tool for performing disclosed embodiments.

A plurality of ALD process stations 400 may be included in a common low pressure process tool environment. For example, FIG. 5 depicts an embodiment of a multi-station processing tool 500. In some embodiments, one or more hardware parameters of ALD process station 400 including those discussed in detail below may be adjusted programmatically by one or more computer controllers 450.

ALD process station 400 fluidly communicates with reactant delivery system 401a for delivering process gases to a distribution showerhead 406. Reactant delivery system 401a includes a mixing vessel 404 for blending and/or conditioning process gases, such as a blocking reagent gas, metal precursor gas, or oxygen-containing gas for delivery to showerhead 406. One or more mixing vessel inlet valves 420 may control introduction of process gases to mixing vessel 404.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. It will be appreciated that, in some embodiments, pedestal height may be adjusted programmatically by a suitable computer controller 450.

In another scenario, adjusting a height of pedestal 408 may allow a plasma density to be varied during plasma activation cycles in the process in embodiments where a plasma is ignited. At the conclusion of the process phase, pedestal 408 may be lowered during another substrate transfer phase to allow removal of substrate 412 from pedestal 408.

In some embodiments, pedestal 408 may be temperature controlled via heater 410. In some embodiments, the pedestal 408 may be heated to a temperature of between about 70° C. and about 200° C., or between about 100° C. and about 120° C.

Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are about 150 W to about 6000 W. Plasma may be used during treatment of a silicon nitride surface prior to selective deposition of silicon oxide on silicon oxide relative to silicon nitride. RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an blocking reagent gas such as an alkylaminosilane or an alkylchlorosilane, instructions for setting a flow rate of a carrier gas (such as argon), and time delay instructions for the first recipe phase. In some embodiments, the substrate is removed from the chamber after the first recipe phase to dip it in a water bath and selectively remove blocking reagent from the metal surface before replacing the substrate in the chamber for a second recipe phase. A second recipe phase may include instructions for setting a flow rate of an inert and/or metal precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of an oxygen-containing gas, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 450 may include any of the features described below with respect to system controller 550 of FIG. 5.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506 at atmospheric pressure is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., blocking reagent gases such as alkylaminosilanes or alkylchlorosilanes, metal precursor gases, and oxygen-containing gases, carrier gases and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted to compare deposition growth on blocked versus unblocked tungsten and silicon oxide surfaces of a substrate. Zirconium oxide was deposited using ALD on a tungsten surface that was not exposed to dimethyldichlorosilane and the number of cycles and thickness deposited are graphed in FIG. 6A as solid plots and a solid line. Zirconium oxide was deposited on a tetraethyl orthosilicate-based silicon oxide surface that was not exposed to dimethyldichlorosilane by ALD and the number of cycles and thickness deposited are graphed in FIG. 6A as the open plots and a dotted line. As shown, growth trends of both films are similar and growth increases at approximately the same rate for both.

Figure 6A:
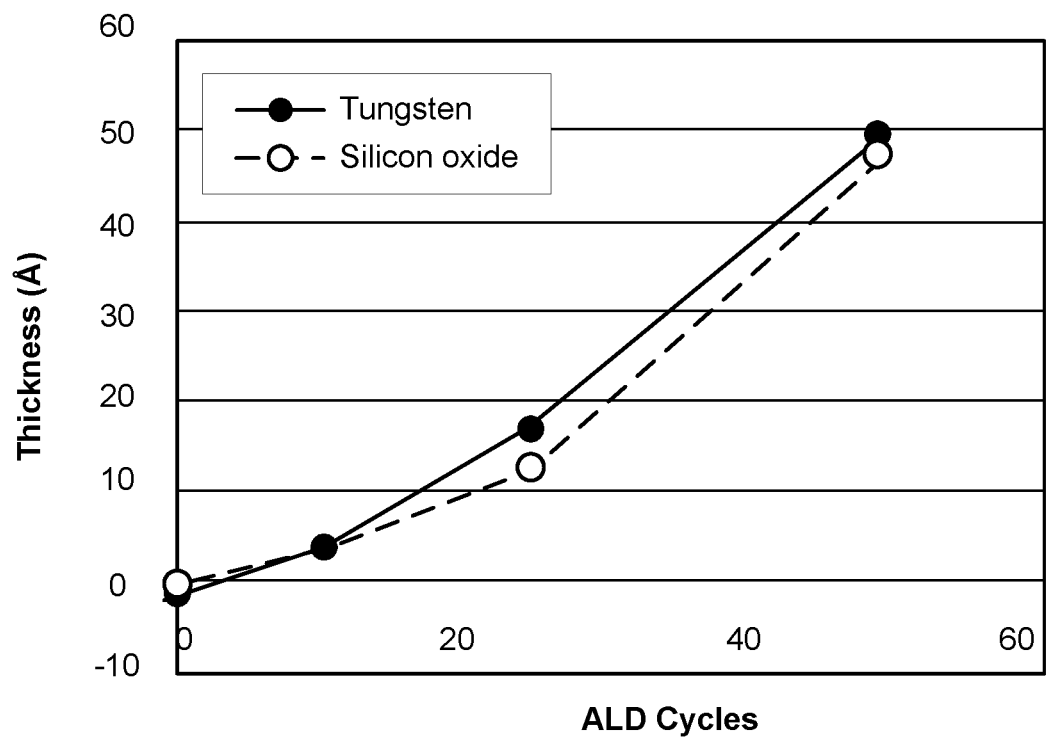
FIG. 6A is a graph depicting thickness of film deposited over particular numbers of ALD cycles for deposition on a tungsten surface and a silicon oxide surface.
Figure 6B:
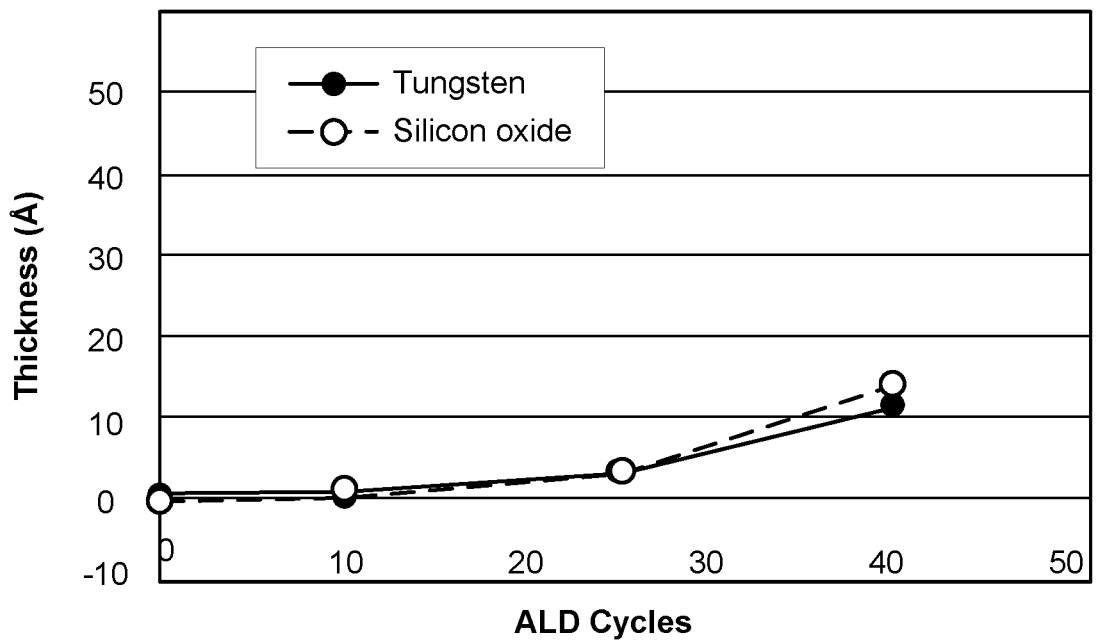
FIG. 6B is a graph depicting thickness of film deposited over particular numbers of ALD cycles for deposition on a tungsten surface and a silicon oxide surface exposed to dimethyldichlorosilane.

Subsequently, a tungsten substrate was first exposed to dimethyldichlorosilane and subsequently, zirconium oxide was deposited on the dimethyldichlorosilane-exposed tungsten substrate using the same ALD cycles as in FIG. 6A. The number of cycles and thickness deposited are graphed in FIG. 6B as solid plots and a solid line. Likewise, a silicon oxide substrate was first exposed to dimethyldichlorosilane and subsequently, zirconium oxide was deposited on the dimethyldichlorosilane-exposed silicon oxide substrate using the same ALD cycles as in FIG. 6A. The number of cycles and thickness deposited are graphed in FIG. 6B as the open plots and a dotted line. As shown, growth of both films is similar to each other, and growth increases at approximately the same rate for both surfaces, but overall deposition thickness for both surfaces compared to FIG. 6A is substantially less—in fact, in the first 10 cycles of ALD, there appears to be little, if any deposition on either of the dimethyldichlorosilane-exposed substrates. The zirconium oxide thickness remains less than 10 even at 30 cycles of ALD. These results suggest dimethyldichlorosilane inhibits deposition on both tungsten and silicon oxide surfaces alike.

Figure 7:
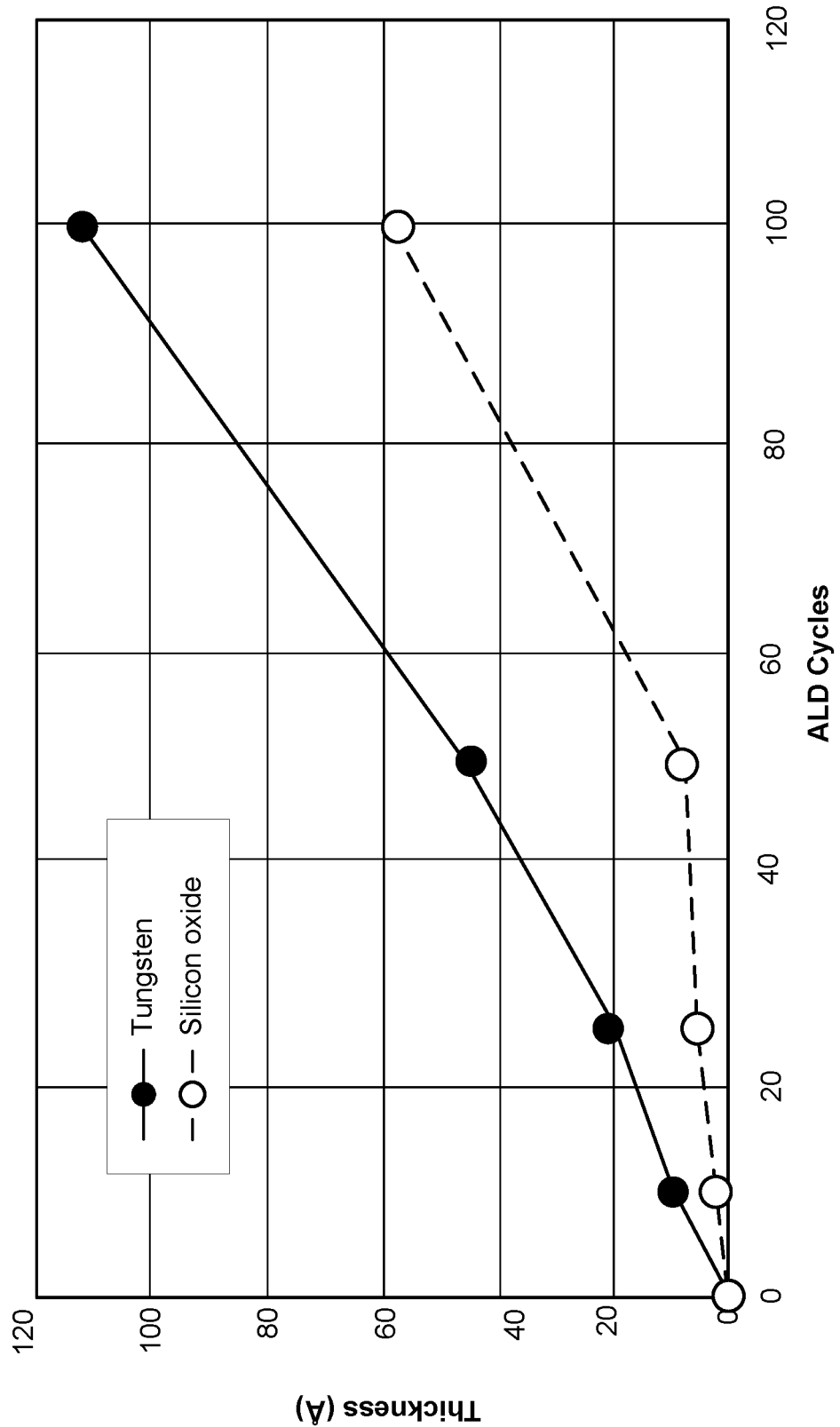
FIG. 7 is a graph depicting thickness of film deposited over particular numbers of ALD cycles for deposition on a tungsten surface and a silicon oxide surface exposed to dimethyldichlorosilane and washed with water in accordance with certain disclosed embodiments.

A substrate having an exposed tungsten surface was exposed to dimethyldichlorosilane and then dipped in water before zirconium oxide was deposited using ALD cycles as in FIG. 6A. The number of cycles and thickness deposited are graphed in FIG. 7 as solid plots and a solid line. Additionally, a substrate having an exposed silicon oxide surface was exposed to dimethyldichlorosilane and then dipped in water before zirconium oxide was deposited using ALD cycles as in FIG. 6A. The number of cycles and thickness deposited are graphed in FIG. 7 as the open plots and a dotted line. As shown in FIG. 7, the initiation of zirconium oxide deposition occurs much sooner on the tungsten surface than on the silicon oxide surface. Further, the zirconium oxide deposition growth is similar to that of FIG. 6A, which suggests that dipping in a water bath removed the inhibitor from the tungsten surface such that zirconium oxide could be deposited. Meanwhile, silicon oxide growth is similar to silicon oxide growth in FIG. 6B, which suggests that dipping in the water bath did not remove the inhibitor from the silicon oxide surface, and thus the silicon oxide surface remains blocked and less zirconium oxide was deposited on that surface. These results indicate viability of using dimethyldichlorosilane as a blocking reagent to allow selective deposition on a tungsten surface relative to a silicon oxide surface.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of selectively depositing metal oxide on an exposed metal surface relative to a dielectric material on a substrate, the method comprising:
   (a) providing the substrate comprising the dielectric material and the exposed metal surface;
   (b) prior to depositing the metal oxide, exposing the substrate to a blocking reagent to non-selectively adsorb the blocking reagent onto both the dielectric material and the exposed metal surface;
   (c) after exposing the substrate to the blocking reagent and prior to depositing the metal oxide, selectively removing the blocking reagent from the exposed metal surface by reacting water to selectively hydrolyze bonds between the blocking reagent and the exposed metal surface; and
   (d) selectively depositing the metal oxide on the exposed metal surface relative to the dielectric material on the substrate.

2. The method of claim 1, wherein selectively removing the blocking reagent is performed by contacting the substrate with water.

3. The method of claim 1, wherein selectively removing the blocking reagent is performed by dipping the substrate in water.

4. The method of claim 1, wherein the blocking reagent is a silicon amide.

5. The method of claim 1, wherein the blocking reagent is an alkylchlorosilane.

6. The method of claim 5, wherein the alkylchlorosilane has a chemical structure of $Cl_xSi([CH_3(CH_2)_y])_{(4-x)}$, where x is an integer between and including 1 and 3, and y is an integer greater than or equal to 1.

7. The method of claim 4, wherein the blocking reagent is an alkylaminosilane.

8. The method of claim 1, wherein the alkylaminosilane has a chemical structure of $[(CH_3)_2N]_xSi([CH_3(CH_2)_y])_{(4-x)}$, where x is an integer between and including 1 and 3, and y is an integer greater than or equal to 1.

9. The method of claim 1, wherein the blocking reagent is provided in an aprotic polar solvent.

10. The method of claim 1, wherein the blocking reagent forms a hydrolyzable bond with the exposed metal surface but does not form a hydrolyzable bond with the dielectric material.

11. The method of claim 1, wherein the substrate is exposed to the blocking reagent by dipping the substrate in a wet solution of the blocking reagent.

12. The method of claim 11, wherein the substrate is exposed to the blocking reagent at a temperature between about 25° C. and about 100° C. or between about 60° C. and about 100° C.

13. The method of claim 1, wherein the metal oxide is alumina.

14. The method of claim 1, wherein the substrate is exposed to the blocking reagent by introducing the blocking reagent in vapor phase.

15. The method of claim 14, wherein the substrate is exposed to the blocking reagent at a temperature between about 100° C. and about 300° C. or between about 200° C. and about 250° C.

16. The method of claim 1, wherein the metal oxide is selectively deposited on the exposed metal surface relative to the dielectric material using atomic layer deposition.

17. The method of claim 1, wherein the substrate is exposed to the blocking reagent for a duration between about 10 seconds and about 60 seconds.

18. The method of claim 1, wherein selectively removing the blocking reagent is performed at room temperature.

19. The method of claim 1, wherein the hydrolyzing results in the exposed metal surface having a hydrogen-terminated and/or hydroxyl-terminated surface.

* * * * *